United States Patent
Ko et al.

(10) Patent No.: US 11,910,549 B2
(45) Date of Patent: Feb. 20, 2024

(54) ELECTRONIC DEVICE FOR SUPPORTING SLIDING

(71) Applicant: Samsung Electronics Co., Ltd., Suwon-si (KR)

(72) Inventors: Sungchan Ko, Suwon-si (KR); Donghun Kim, Suwon-si (KR); Jooho Seo, Suwon-si (KR); Hangil Song, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 748 days.

(21) Appl. No.: 17/042,636

(22) PCT Filed: Aug. 26, 2020

(86) PCT No.: PCT/KR2020/011385
§ 371 (c)(1),
(2) Date: Sep. 28, 2020

(87) PCT Pub. No.: WO2021/049785
PCT Pub. Date: Mar. 18, 2021

(65) Prior Publication Data
US 2023/0124270 A1 Apr. 20, 2023

(30) Foreign Application Priority Data

Sep. 11, 2019 (KR) .................. 10-2019-0113144
Jan. 8, 2020 (KR) .................. 10-2020-0002378

(51) Int. Cl.
*H05K 5/02* (2006.01)
*H05K 5/00* (2006.01)
(Continued)

(52) U.S. Cl.
CPC ........... *H05K 5/0217* (2013.01); *G05B 15/02* (2013.01); *G06F 1/1624* (2013.01);
(Continued)

(58) Field of Classification Search
CPC .. H05K 5/0217; H05K 5/0017; G06F 1/1624; G06F 1/1615; G06F 1/1652; H04M 1/0235; H04M 1/0268
See application file for complete search history.

(56) References Cited

U.S. PATENT DOCUMENTS

| 8,711,566 B2 | 4/2014 | O'Brien |
| 9,195,272 B2 | 11/2015 | O'Brien |
| (Continued) | | |

FOREIGN PATENT DOCUMENTS

| KR | 10-2014-0059274 A | 5/2014 |
| KR | 10-2017-0006089 A | 1/2017 |
| (Continued) | | |

OTHER PUBLICATIONS

International Search Report dated Dec. 8, 2020, issued in an International Application No. PCT/KR2020/011385.
(Continued)

*Primary Examiner* — Abhishek M Rathod
(74) *Attorney, Agent, or Firm* — Jefferson IP Law, LLP

(57) ABSTRACT

An electronic device is provided. The electronic device includes a first cover, a second cover coupled to the first cover to slide, a display in which a size of an exposed region is changed corresponding to the sliding of the second cover, a panel support disposed on one side of a back surface of the display with respect to a front surface of the display on which a screen is displayed, and a rotation shaft contacting at least a portion of the panel support and rotating corresponding to the sliding of the second cover, and an attractive force may be formed between the portion of the rotation shaft and the portion of the panel support.

23 Claims, 13 Drawing Sheets

(51) Int. Cl.
*G06F 1/16* (2006.01)
*G05B 15/02* (2006.01)
*H02K 7/116* (2006.01)
*H04M 1/02* (2006.01)

(52) U.S. Cl.
CPC ........... *H05K 5/0018* (2022.08); *H02K 7/116* (2013.01); *H04M 1/0237* (2013.01); *H05K 5/0086* (2013.01)

(56) References Cited

U.S. PATENT DOCUMENTS

| | | | |
|---|---|---|---|
| 9,697,941 B2 | 7/2017 | Lee | |
| 10,321,583 B2 | 6/2019 | Seo et al. | |
| 10,448,521 B2* | 10/2019 | Seo | H05K 1/189 |
| 10,499,515 B2* | 12/2019 | Lee | G09F 9/301 |
| 10,547,718 B2 | 1/2020 | Lee | |
| 10,617,017 B2 | 4/2020 | Park et al. | |
| 10,887,438 B2 | 1/2021 | Baek et al. | |
| 10,977,771 B2* | 4/2021 | Jeong | G06F 3/0487 |
| 11,140,790 B2* | 10/2021 | Kim | H04B 1/3877 |
| 11,140,794 B2* | 10/2021 | Ran | G06F 1/1652 |
| 11,212,379 B2 | 12/2021 | Baek et al. | |
| 11,775,016 B2* | 10/2023 | Choi | G06F 1/1681 |
| | | | 361/679.01 |
| 2007/0146243 A1* | 6/2007 | Ou Yang | G06F 1/1601 |
| | | | 345/76 |
| 2012/0314400 A1* | 12/2012 | Bohn | H04M 1/0237 |
| | | | 361/679.01 |
| 2013/0058063 A1* | 3/2013 | O'Brien | G06F 1/1624 |
| | | | 361/807 |
| 2014/0211399 A1 | 7/2014 | O'Brien | |
| 2015/0047796 A1 | 2/2015 | Peng et al. | |
| 2015/0153777 A1 | 6/2015 | Liu et al. | |
| 2016/0278222 A1 | 9/2016 | Lee | |
| 2017/0212607 A1 | 7/2017 | Yoon | |
| 2017/0367198 A1 | 12/2017 | Park et al. | |
| 2018/0102072 A1* | 4/2018 | Lee | G02F 1/133305 |
| 2018/0103550 A1 | 4/2018 | Seo et al. | |
| 2018/0198899 A1 | 7/2018 | Lee | |
| 2019/0261519 A1 | 8/2019 | Park et al. | |
| 2019/0268455 A1* | 8/2019 | Baek | G06F 1/1684 |
| 2020/0363841 A1 | 11/2020 | Kim et al. | |
| 2021/0126993 A1 | 4/2021 | Baek et al. | |

FOREIGN PATENT DOCUMENTS

| | | |
|---|---|---|
| KR | 10-2017-0089664 A | 8/2017 |
| KR | 10-2019-0062855 A | 6/2019 |
| KR | 10-2019-0101184 A | 8/2019 |
| KR | 10-2019-0101605 A | 9/2019 |

OTHER PUBLICATIONS

Extended European Search Report dated Jul. 13, 2022, issued in a counterpart European Application No. 20863207.5.
Korean Office Action dated Nov. 3, 2023, issued in Korean Patent Application No. 10-2020-0002378.

* cited by examiner

ELECTRONIC DEVICE FOR SUPPORTING SLIDING

CROSS-REFERENCE TO RELATED APPLICATION(S)

This application is a U.S. National Stage application under 35 U.S.C. § 371 of an International application number PCT/KR2020/011385, filed on Aug. 26, 2020, which is based on and claims priority of a Korean patent application number 10-2019-0113144, filed on Sep. 11, 2019, and a Korean patent application number 10-2020-0002378, filed on Jan. 8, 2020, in the Korean Intellectual Property Office, the disclosure of which is incorporated by reference herein in its entirety.

TECHNICAL FIELD

The disclosure relates to a structure of an electronic device for supporting sliding.

BACKGROUND ART

In recent years, portable electronic devices have been manufactured in a form in which displays of various sizes are mounted based on various purposes such as portability and usability. In addition, in order to meet various needs of users, electronic devices capable of adjusting the size of a display have been developed. As an example, research on flexible displays of a roll structure mounted on the electronic device has been increasingly conducted. The flexible display of the roll structure may be expanded to have a large area by unfolding a rolled region corresponding to the structural deformation of the electronic device.

The above information is presented as background information only to assist with an understanding of the disclosure. No determination has been made, and no assertion is made, as to whether any of the above might be applicable as prior art with regard to the disclosure.

DISCLOSURE OF THE INVENTION

Technical Problem

The electronic device of the roll structure that supports sliding may have a state in which a portion of a display is wound, and a state in which the wound portion of the display is unfolded through the sliding. When the portion of the display changes from the unfolded state to the wound state, the repulsive force against the winding force may act on the wound part of the display. Accordingly, there is a limitation that deformation occurs in which at least a portion of the wound part of the display protrudes more than the surroundings. In addition, while sliding, the portion of the display may be damaged due to friction with other structures of the electronic device.

Aspects of the disclosure are to address at least the above-mentioned problems and/or disadvantages and to provide at least the advantages described below. Accordingly, an aspect of the disclosure is to provide an electronic device for supporting sliding, which is capable of preventing damage to a display while maintaining flatness of the display.

Additional aspects will be set forth in part in the description which follows and, in part, will be apparent from the description, or may be learned by practice of the presented embodiments.

Technical Solution

In accordance with an aspect of the disclosure, an electronic device is provided. The electronic device includes a first cover, a second cover coupled (or fastened, connected) to the first cover and sliding, a display in which a size of an exposed region is changed corresponding to the sliding of the second cover, a panel support disposed on one side of a back surface of the display based on a front surface of the display on which a screen is displayed, and a rotation shaft contacting at least a portion of the panel support and rotating corresponding to the sliding of the second cover, and an attractive force may be formed between the portion of the rotation shaft and the portion of the panel support.

In accordance with another aspect of the disclosure, an electronic device is provided. The electronic device includes a first cover, a second cover coupled (or fastened, or connected) to the first cover to slide, a display in which a size of an exposed region is changed corresponding to the sliding of the second cover, a display support member supporting a first region of the display, a sliding structure at least partially disposed under the display support member, a first driving unit at least partially coupled (or fastened, or connected) to a guide rail formed on the bottom of the display support member and moving the sliding structure in a first direction or a second direction opposite to the first direction, a panel support including a plurality of protrusions disposed on a back surface of a second region of the display based on a front surface of the display on which a screen is displayed, a second driving unit contacting at least a portion of the panel support and performing a rotation required for winding of the panel support, and at least one processor configured to control operations of the first driving unit and the second driving unit.

Various respective aspects and features of the disclosure are defined in the appended claims. Combinations of features from the dependent claims may be combined with features of the independent claims as appropriate and not merely as explicitly set out in the claims.

Furthermore, one or more selected features of any one embodiment herein described may be combined with one or more selected features of any other embodiment herein described, provided that the alternative combination of features at least partially alleviates the one or more technical problem herein discussed or at least partially alleviates a technical problem discernable by the skilled person from this disclosure and further provided that the particular combination or permutation of embodiment features thus formed would not be understood by the skilled person to be incompatible.

Two or more physically distinct components in any described example implementation of this disclosure may alternatively be integrated into a single component where possible, provided that the same function is performed by the single component thus formed. Conversely, a single component of any embodiment herein described may alternatively be implemented as two or more distinct components to achieve the same function, where appropriate.

It is an aim of certain embodiments of the disclosure to solve, mitigate or obviate, at least partly, at least one of the problems and/or disadvantages associated with the prior art. Certain embodiments aim to provide at least one of the advantages described below.

Advantageous Effects

As described above, according to the embodiments of the disclosure, it is possible to maintain the flatness of a display.

Besides, various effects may be provided that are directly or indirectly identified through the disclosure.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

MODE FOR CARRYING OUT THE INVENTION

Figure 1:
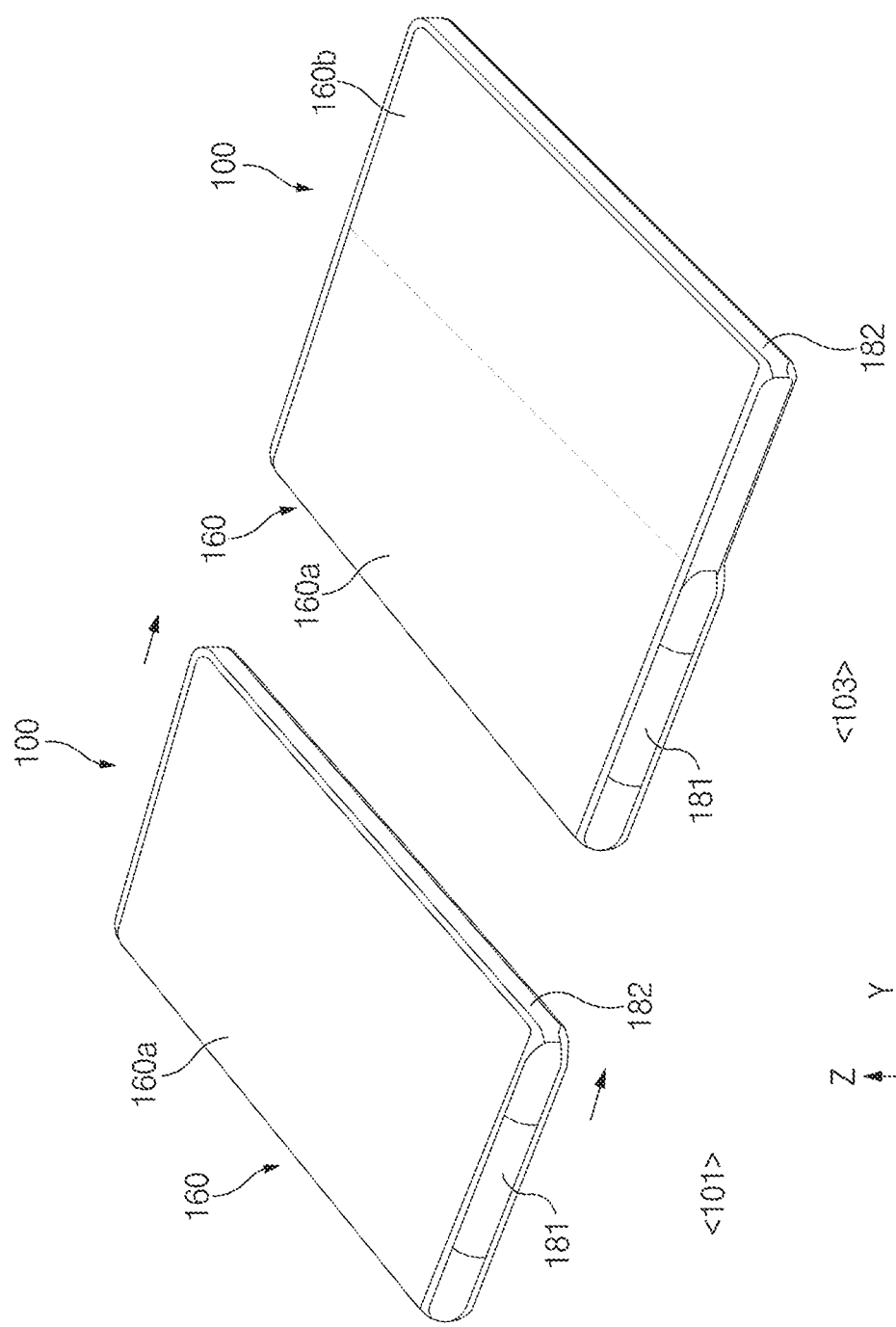
FIG. 1 is a diagram illustrating an external shape of an electronic device according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

As used here, terms and phrases, such as "have", "may have", "include", or "may include" indicates the existence of features (e.g., numbers, functions, actions, or parts, such as components), and do not exclude the existence of additional features.

As used here, the phrases "A or B", "at least one of A or/and B", or "one or more of A or/and B" may include all possible combinations of the items listed together. For example, "A or B", "at least one of A and B", or "at least one of A or B" may indicate all of (1) including at least one A, (2) including at least one B, or (3) including both at least one A and at least one B.

As used here, the terms, such as "first", "second", "the first", or "the second" may modify various components, regardless of order and/or importance, and are used to distinguish one component from another, but do not limit the components. For example, the first user device and the second user device may indicate different user devices regardless of order or importance. For example, without departing from the teachings disclosed in the disclosure, a first element could be termed a second element, and similarly, in reverse, a second element could be termed a first element.

When a component (e.g., first component) is referred to as being "(operatively or communicatively) coupled with/to" or "connected to" another component (e.g., second component), it should be understood that any of the above components may be directly connected to another component, or may be connected via another component (e.g., a third component). In contrast, when a certain component (e.g., first component) is referred to as being "directly coupled" or "directly connected" to another component (e.g., second component), it is to be understood that no other component (e.g., third component) intervenes between the certain component and the other component.

As used here, the phrase, "configured to (or set to)", may be interchangeably used with, for example, "suitable for", "having the capacity to", "designed to", "adapted to", "made to", or "capable of", depending on the circumstances. The phrase "configured (or set) to" may not necessarily mean only "specifically designed to" in hardware. Rather, in some circumstances, the phrase "device configured to" may mean that the device "can" perform an operation with other devices or parts. For example, the phrase "processor configured (or set) to perform A, B, and C" may mean a dedicated processor (e.g., embedded processor) for performing corresponding operations, or a generic-purpose processor (e.g., central processing unit (CPU) or application processor) that performs the operations by executing one or more software programs stored in a memory device.

The terms and phrases as used here are merely provided to describe specific embodiments of the disclosure, and may not be intended to limit the scope of other embodiments. A singular form is intended to include a plural form, unless the context clearly indicates otherwise. Terms, including technical or scientific terms, as used here, may have the same meaning as commonly understood by a person skilled in the art to which the embodiments of the disclosure belong. Terms, such as those defined in commonly-used dictionaries should be interpreted as having a meaning that is consistent with their meaning in the context of the relevant art and will not be interpreted in an idealized or overly formal sense unless expressly so defined here. In some cases, even terms defined here cannot be interpreted to exclude embodiments of the disclosure.

Examples of an electronic device according to various embodiments of the disclosure may include at least one of a smartphone, a tablet personal computer (PC), a mobile phone, a video phone, an e-book reader, a desktop PC, a laptop personal computer, a netbook computer, a workstation, a server, a personal digital assistant (PDA), a portable multimedia player (PMP), a moving picture experts group (MPEG-1 or MPEG-2) audio layer 3 (MP3) player, a mobile medical device, a camera, or a wearable device. According to various embodiments of the disclosure, the wearable device may include at least one of an accessory-type device (e.g., watches, rings, bracelets, anklets, necklaces, glasses, contact lenses, or head-mounted devices (HMD), a textiles or clothing integrated-type device (e.g., electronic clothing), a body attachment-type device (e.g., skin pads or tattoo), or a bio-implantable-type device (implantable circuits).

Hereinafter, an electronic device according to various embodiments will be described with reference to the accompanying drawings. In the disclosure, the term user may refer to a person using an electronic device or a device using the electronic device (e.g., an artificial intelligence electronic device).

The scope of protection is defined by the appended independent claims. Further features are specified by the appended dependent claims. Example implementations may be realized by comprising one or more features of any claim taken jointly and severally in any and all permutations.

The examples herein described include non-limiting example implementations of components corresponding to one or more features specified by the appended independent claims and these features (or their corresponding components) either individually or in combination may contribute to ameliorating one or more technical problems deducible by the skilled person from this disclosure.

Furthermore, one or more selected components of any one example herein described may be combined with one or more selected components of any other one or more examples herein described, or alternatively may be combined with features of an appended independent claim to form a further alternative example.

Further example implementations can be realized by comprising one or more components of any herein described implementation taken jointly and severally in any and all permutations. Yet further example implementations may also be realized by combining features of one or more of the appended claims with one or more selected components of any example implementation herein described.

In forming such further example implementations, some components of any example implementation herein described may be omitted. The one or more components that may be omitted are those components that the skilled person would directly and unambiguously recognize as being not, as such, indispensable for the function of the present technique in the light of a technical problem discernible from this disclosure. The skilled person would recognize that replacement or removal of such omitted components does not require modification of other components or features of the further alternative example to compensate for the change. Thus, further example implementations may be included in this disclosure according to the present technique, even if the selected combination of features and/or components is not specifically recited.

Two or more physically distinct components in any example implementation herein described may alternatively be integrated into a single component where possible, provided that the same function is performed by the single component thus formed. Conversely, a single component of any example implementation herein described may alternatively be implemented as two or more distinct components to achieve the same function, where appropriate.

FIG. 1 is a diagram illustrating an external shape of an electronic device according to an embodiment of the disclosure.

Referring to FIG. 1, an electronic device 100, according to an embodiment of the disclosure, may include a display 160 (e.g., a flexible display having at least a portion of flexibility), a first cover 181, and a second cover 182. The first cover 181 may serve as a fixed cover to which one side of the display 160 is fixed. The second cover 182 may be moved in a first direction (e.g., x-axis direction) or in a second direction (e.g., −x-axis direction opposite to the first direction), based on the first cover 181. As in a state 101, when the first cover 181 and the second cover 182 overlap by a first width, a first display region 160a of the first size may be disposed to be directed upward (z-axis direction). Alternatively, in the state 101, the display 160 may include the first display region 160a of the first size that is exposed to the outside. The first cover 181 may be disposed to surround at least a portion of one side edge of the first display region 160a (e.g., based on the illustrated drawing, at least a portion of the first display region 160a in the second direction (−x-axis direction), at least a portion in a third direction (y-axis direction), at least a portion in a fourth direction (−y-axis direction), and at least a portion in a fifth direction (−z-axis direction, which is opposite to the z-axis direction)). In the state 101, the first display region 160a and at least a portion of a second display region 160b to be extended may be disposed to be wound on the inner side of at least one of the first cover 181 and the second cover 182, or may be disposed to be unfolded. In this state, pixels of the first display region 160a may be disposed such that the surface thereof emitting light is directed toward the front (z-axis direction), and at least a portion of the upper surface of the second display region 160b on which pixels are disposed is directed toward the back (−z-axis direction). A portion of the second display region 160b may be disposed to be bent.

If the second cover 182 is moved in the first direction (x-axis direction) based on the first cover 181, the exposed region of the display 160 may be expanded. For example, as in a state 103 (e.g., a state in which the second cover 182 has slid in order to expand the region of the display 160), when the first cover 181 and the second cover 182 overlaps by a second width (e.g., width smaller than the first width), the display 160 may include the first display region 160a of the first size and the second display region 160b of a second size, which are exposed to the outside (directed upward (z-axis direction)). In the state 103, the first size of the first display region 160a and the second size of the second display region 160b may be the same. Alternatively, the first size may be larger than the second size. According to various embodiments of the disclosure, the second size may vary according to a sliding distance or a moving distance of the second cover 182.

The display 160 maintains a partially wound state in the state 101, and in the state 103, at least a portion that has been in the wound state may have an unfolded state. The second cover 182 may be disposed to surround at least a portion of the second display region 160b in the first direction (x-axis direction), at least a portion in the third direction (y-axis direction), at least a portion in the fourth direction (-y-axis direction), and at least a portion in the fifth direction (-z-axis direction). According to various embodiments of the disclosure, the second cover 182 may be at least partially connected to the inside of the first cover 181, and slide along the inner surface of the first cover 181 in any one of the first direction (x-axis direction) and the second direction (-x-axis direction). The first cover 181 and the second cover 182 may be disposed to surround an edge of the display 160 while the first cover 181 and the second cover 182 are sliding. Various electronic elements related to driving the display 160, electronic elements related to various user functions supported by the electronic device 100, batteries, and so on may be disposed on the inner side of the first cover 181 and the second cover 182.

Figure 2:
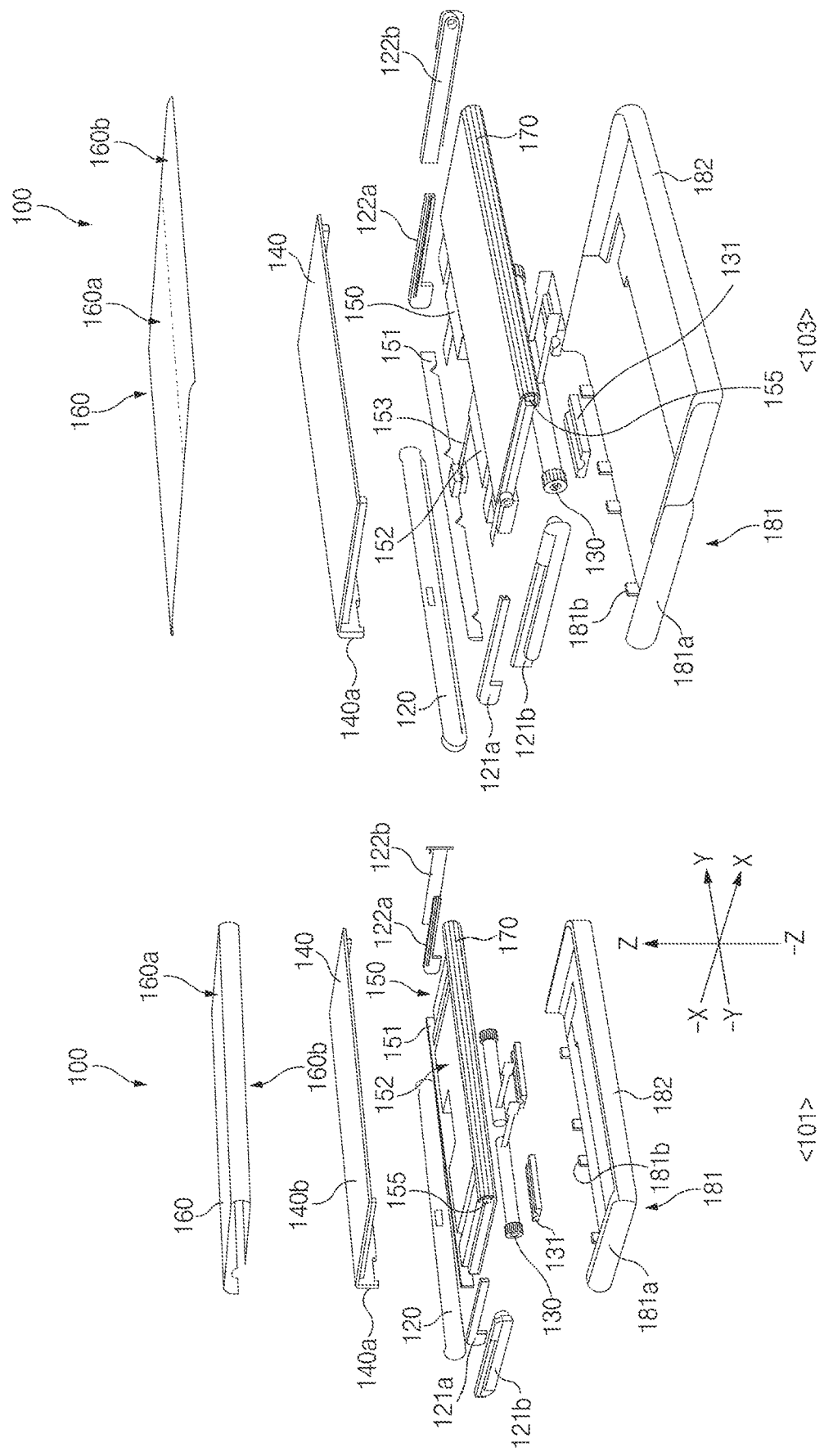
FIG. 2 is a diagram illustrating a portion of an internal structure of an electronic device according to an embodiment of the disclosure.
Figure 3:
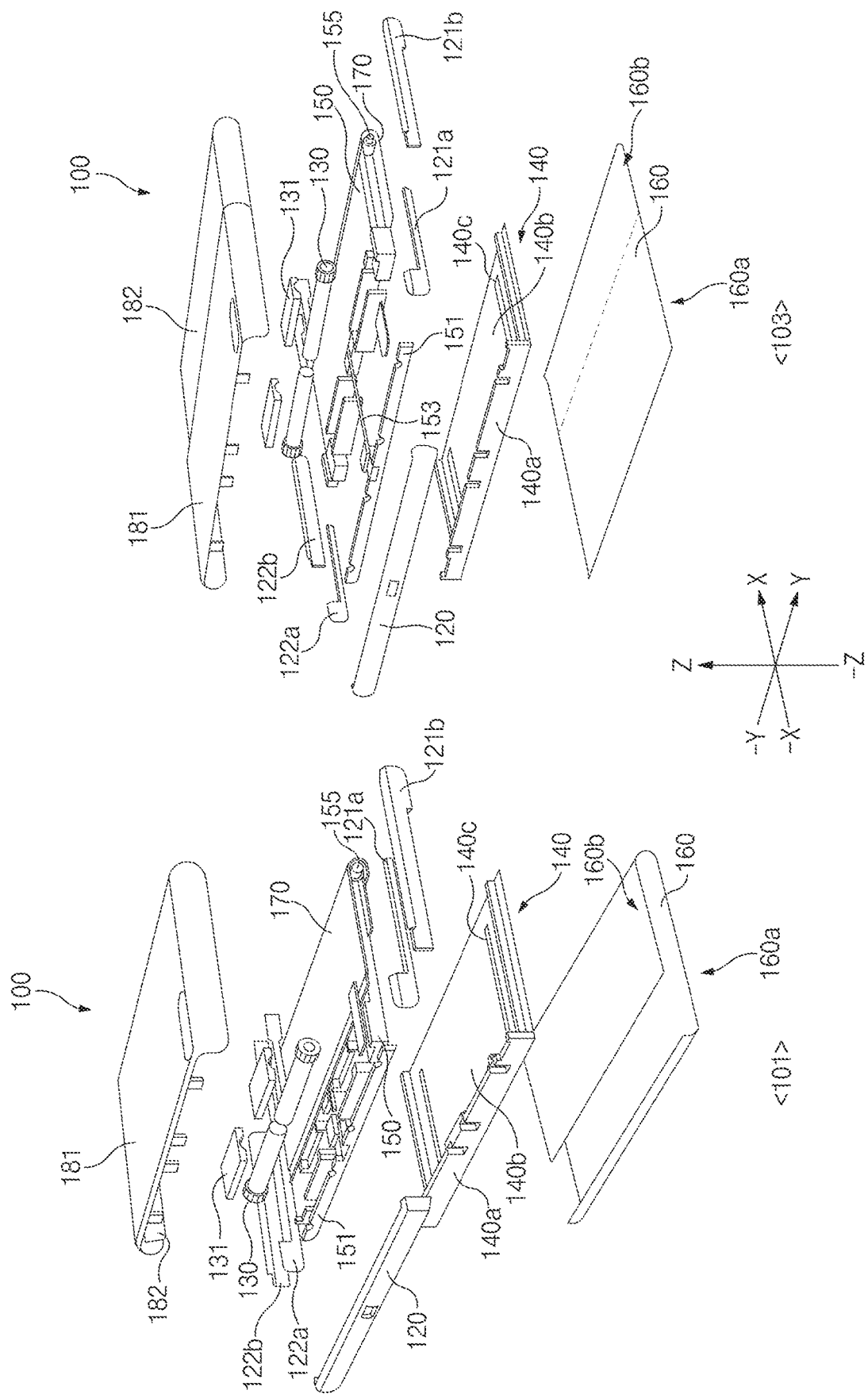
FIG. 3 is a diagram illustrating an exploded perspective view of components of an electronic device based on a first direction according to an embodiment of the disclosure.

FIG. 2 is a diagram illustrating an exploded perspective view of configurations of an electronic device based on a first direction according to an embodiment of the disclosure. FIG. 3 is a diagram illustrating an exploded perspective view of configurations of an electronic device based on a second direction according to an embodiment of the disclosure. For example, FIG. 2 is a diagram illustrating a structure in which the display 160 is disposed on the covers 181 and 182 from the fifth direction (-z-axis direction) to a sixth direction (z-axis direction), and FIG. 3 is a diagram illustrating a structure in which the covers 181 and 182 and the display 160 are disposed in a direction opposite to that in FIG. 2.

Referring to FIGS. 2 and 3, the electronic device 100 according to an embodiment may include the display 160, a first display support member 140, a sliding structure 150, a first sliding support member 121a, a first sliding member 121b, a second sliding support member 122a, a second sliding member 122b, an actuator 130, an actuator support member 131, the first cover 181, and the second cover 182.

According to an embodiment of the disclosure, the display 160 may have a plurality of pixels arranged in a matrix form, and at least a portion of the display 160 may be provided in a flexible form. According to an embodiment of the disclosure, the display 160 may include a panel layer on which a plurality of pixels are arranged and a screen is displayed, and an outer protective layer over the panel layer. The outer protective layer may be formed of a polymer structure (e.g., polyimide) or glass. Additionally, the display 160 may further include a touch panel layer. As described in FIG. 1, the display 160 may include the first display region 160a and the second display region 160b. At least a portion of the second display region 160b may be disposed to be wound on the inner side of the second cover 182 in the state 101, and may be exposed outside the second cover 182 in the state 103. While at least a portion of the second display region 160b is disposed to be wound and thus to be bent relative to a first rotation shaft 155 (or a rolling gear part or a rotation shaft member), the remaining portion may be disposed on the back surface of the first display region 160a.

One side of the display 160 (e.g., at least a portion of the second display region 160b) may be mounted on the inner side of at least one of the first cover 181 and the second cover 182. In this state, one side end of the display 160 disposed on the inner side of the electronic device 100 may be coupled (or fastened, or connected, or engaged)) to an elastic member.

The elastic force of the elastic member acts on the display 160 as a tension while the second display region 160b of the display 160 is exposed to the outside, and thus the repulsive force in the bent portion of the display 160 is canceled out. In this way, the wound portion of the display 160 may be maintained uniformly.

The first display support member 140 may have a specified rigidity and may support the display 160. For example, at least a portion of the first display support member 140 may be provided as aluminum or an aluminum alloy, and a surface thereof facing the display 160 may be formed to be flat. According to an embodiment of the disclosure, at least a portion of the first display support member 140 may be provided as an injection material (e.g., a structure containing magnesium). In the state 101, a first surface of the first display support member 140 (e.g., a surface observed in the z-axis direction) may face the back surface of the first display region 160a (e.g., a surface observed in the -z-axis direction). A second surface of the first display support member 140 (e.g., a surface observed in the -z-axis direction) may be disposed to face the upper surface of the sliding structure 150 (e.g., a surface observed in the z-axis direction).

The first display support member 140 may have a sidewall 140a formed on one side, and may include a flat region 140b perpendicular to the sidewall 140a and supporting the portion of the display 160. Accordingly, a cross-section of the first display support member 140 may be provided in an "L" shape. The sidewall 140a may be coupled with at least one of a guard member 120 of the first cover 181 and a fixing part 151 of the sliding structure 150. According to various embodiments of the disclosure, additional sidewalls for supporting the first sliding member 121b and the second sliding member 122b may be disposed on both side edges of the first display support member 140 (e.g., both side edges adjacent to the sidewall 140a), respectively.

At least one guide rail 140c may be formed on the back surface of the first display support member 140 (a surface observed in the -z-axis direction). The guide rail 140c may be provided as a groove having a predetermined length on the back surface of the first display support member 140. At least portions of the first sliding support member 121a and the second sliding support member 122a may be seated on the guide rail 140c.

At least a portion of the sliding structure 150 may be coupled with the second cover 182, and may be slid with sliding of the second cover 182. Alternatively, the sliding structure 150 may be moved by an actuator. In this regard, a separate physical button capable of instructing the driving of the actuator may be disposed in the electronic device 100 or a menu related to driving the actuator may be output on the display screen of the display 160. As at least a portion of the sliding structure 150 is moved in the first direction while the second cover 182 is moved in the first direction (x-axis direction), the disposition direction of the second display region 160b of the display 160 fixed to the sliding structure 150 may be changed from the sixth direction (-z-axis direction) to the fifth direction (z-axis direction).

The sliding structure 150 may include the fixing part 151, a second display support member 152, a first panel support 170, the first rotation shaft 155, and a connecting part 153.

The fixing part 151 may be formed to have a predetermined length in the third direction (y-axis direction) (e.g., a length corresponding to the long axis of the sidewall 140a of the first display support member 140). The fixing part 151 may be disposed side by side with the guard member 120 of the second cover 182. Alternatively, the fixing part 151 may be disposed side by side with the sidewall 140a of the first display support member 140. At least a portion of the fixing part 151 may be coupled with at least one of the guard member 120 and the sidewall 140a. In this regard, at least one hole penetrating the front and back surfaces (e.g., from the y-axis direction to the −y-axis direction) may be disposed on one side of the fixing part 151.

The second display support member 152 may be disposed such that the upper surface (e.g., a surface observed in the z-axis) faces the lower surface (e.g., a surface observed in the −z-axis) of the first display support member 140 in the state 101. The lower surface of the second display support member 152 (e.g., the surface observed in the −z-axis) may be disposed to face at least a portion of the inner side of the first cover 181 or the inner side of the second cover 182. At least one hardware (e.g., a printed circuit board and a battery) related to driving the electronic device 100 may be disposed on the inner side of the second display support member 152. The second display support member 152 may be moved together with the movement of the second cover 182. While the second display support member 152 is moved in the first direction (x-axis direction), at least a portion of the first panel support 170, which has been in a state of being disposed on the lower surface of the second display support member 152, may be moved to the upper surface of the second display support member 152.

The first panel support 170 may have a shape in which a plurality of protrusions (or pillars, long bars, or slates) with a predetermined length in the third direction (y-axis direction) are disposed at certain intervals. At least a portion of the first panel support 170 may form a track, and may move (or slide) a portion of the display (e.g., the second display region 160b) disposed on the track. The length of one side of the protrusions may correspond to the length of one side of the display 160. The first panel support 170 may be disposed to surround at least a portion of the second display support member 152. The plurality of protrusions constituting the first panel support 170 may be disposed such that the surface facing the back surface of the display 160 is flat, and the part disposed to be directed toward the inner side of the sliding structure 150 (e.g., the part facing the first rotation shaft 155) may be formed to protrude. For example, on the lower surface (e.g., one surface of the protrusions facing the sliding structure) of the first panel support 170, peaks and troughs of gear may be repeatedly formed. With the sliding, among the plurality of protrusions constituting the first panel support 170, the protrusions disposed on the upper surface of the second display support member 152 may be continuously disposed with other neighboring protrusions, forming a flat surface. Among the plurality of protrusions constituting the first panel support 170, protrusions disposed at the position facing the first rotation shaft 155 may be disposed to be spaced apart from neighboring protrusions at certain intervals. The first panel support 170 may include a connecting chain or connecting shaft connecting a plurality of protrusions. At least one of the plurality of protrusions may be provided as a material that reacts to magnetic force (e.g., a magnetic material (an object that forms an attractive force in reaction to magnetic force) or a magnet).

The first rotation shaft 155 (or a rolling gear part, or the rotation shaft member) may have a length similar to the length of one side of the second display support member 152 and may be disposed side by side with one side edge of the second display support member 152. The first rotation shaft 155 may be provided in a cylindrical rod shape. The centers of both sides of the first rotation shaft 155 may be formed to protrude more than the surroundings. The protruding centers of both sides of the first rotation shaft 155 may be mounted on one side of the second cover 182. Accordingly, the first rotation shaft 155 may rotate while the second cover 182 is moved in the first direction (x-axis direction). At least a portion of the first rotation shaft 155 may be geared with the first panel support 170. Alternatively, the first rotation shaft 155 may contact at least a portion of the first panel support 170. The disposition form of the first panel support 170 may be changed while the first rotation shaft 155 rotates. For example, while the first rotation shaft 155 rotates in the first rotating direction (e.g., the right hand winding direction), at least a portion of the first panel support 170 may be moved to the upper surface (the surface observed in the z-axis direction) of the second display support member 152. While the first rotation shaft 155 rotates in the second rotating direction (e.g., the left hand winding direction), at least a portion of the first panel support 170 may be moved between the lower surface of the second display support member 152 (or second display support member 152) and the second cover 182.

The connecting part 153 may connect the fixing part 151 and the second display support member 152. In this regard, one side of the connecting part 153 may be fixed to a certain position of the fixing part 151 (e.g., the center of the fixing part 151), and the other side may be coupled (or fastened, or connected, or engaged) to the lower surface of the second display support member 152 (e.g., surface that may be observed in the z-axis). The connecting part 153 may include a gear pattern having at least one peak and trough. According to various embodiments of the disclosure, the connecting part 153 may be implemented in a rack form. The second display support member 152 may be moved in the first direction (x-axis direction) and the second direction (−x-axis direction) with being coupled (or fastened, or connected, or engaged) to the connecting part 153.

The first sliding support member 121a may be mounted on one side of the first display support member 140 and may be coupled to the first sliding member 121b such that the first sliding member 121b is movable. In this regard, the first sliding support member 121a may be disposed side by side with one side of the second display support member 152 (e.g., a side surface observed in the −y-axis direction) and may include a support part seated on the guide rail 140c and a protruding part protruding from the support part to allow at least a portion to fasten to the first sliding member 121b.

At least a portion of the first sliding member 121b may be coupled to the first sliding support member (121a) seated on the guide rail (140c), and may be coupled with the second display support member 152. The first sliding member 121b may be formed to correspond at least partially to the shape of one side of the second display support member 152 (e.g., a side surface observed in the −y-axis direction).

The second sliding support member 122a has the same shape as the first sliding support member 121a, but may be disposed at a position spaced apart from the first sliding support member 121a by a predetermined distance. For example, the second sliding support member 122a may be disposed at a position opposite to the first sliding support member 121a based on the sliding structure 150. The second sliding support member 122a may be seated at least partially on the guide rail 140c formed on the first display support member 140 and may be coupled to the second sliding member 122b.

The second sliding member 122b may be coupled to one side of the second sliding support member 122a and may be coupled with the second display support member 152. The second sliding member 122b may be disposed at a position opposite to the first sliding member 121b based on the sliding structure 150.

The actuator 130 may generate power by receiving electric power from a battery included in the electronic device 100. A pinion gear may be disposed on one side of the actuator 130, and the pinion gear may operate on a rack formed on one side of the sliding structure 150. Accordingly, according to the operation, the actuator 130 may operate to be disposed close to the guard member 120 in the state 101, and may operate to be moved in a direction away from the guard member 120 (or a direction toward the second cover 182) in the state 103. The actuator 130 may be disposed in the longitudinal direction (e.g., y-axis or −y-axis direction) of the sliding structure 150. In the illustrated drawing, two actuators are illustrated as being arranged on the same axis.

The actuator support member 131 may support one side of the body of the actuator 130. The actuator support member 131 may be moved together with the movement of the actuator 130.

The first cover 181 may include a cover base 181a including a bottom surface on which at least a portion of the sliding structure 150 is seated and sidewalls disposed to surround edges of the sliding structure 150 (e.g., side portions disposed at the ends in the y-axis direction and the −y-axis direction), the guard member 120 fixing the first display support member 140 and the fixing part 151 in a state where the sidewall 140a of the first display support member 140 and the fixing part 151 are disposed, and a fastening part 181b fastening the guard member 120. The fastening part 181b is disposed on the side of the first cover 181 in the second direction (−x-axis direction), and at least a portion of the first cover 181 in the second direction (−x-axis direction) may be closed as the guard member 120 is coupled to the fastening part 181b. The first cover 181 may be in an open state in the first direction (x-axis direction), and the second cover 182 may be coupled to the first cover 181 in the first direction (x-axis direction).

The second cover 182 may be coupled to the first cover 181 in the first direction (x-axis direction). The second cover 182 may include a bottom surface on which at least a portion of the sliding structure 150 is seated and sidewalls (e.g., sidewalls disposed in the x-direction, the y-axis direction, and the −y-axis direction) that surround side surfaces of the sliding structure 150. The second cover 182 may be moved in the first direction (x-axis direction) or the second direction (−x-axis direction) in a state in which the sliding structure 150 is seated thereon. In this case, the disposition form and position of the second cover 182 may be changed according to the actuator operation.

In the electronic device 100 according to an embodiment having the above-described structure, at least some of the plurality of protrusions constituting the first panel support 170 may include a magnet member or a magnetic material. Further, at least a portion of the first rotation shaft 155 may include a magnet member or a magnetic material. Accordingly, the first panel support 170 on which the display 160 of the electronic device 100 is seated may prevent the display 160 from being lifted by magnetic force in the process of coming into contact with the first rotation shaft 155 (or offset the repulsive force caused by warping of the display). As a result, the flatness of the display 160 around the first rotation shaft 155 may be maintained within a specified range.

Meanwhile, in the above description, a structure in which various components of the electronic device 100 are disposed has been described; however, the disclosure is not limited thereto. For example, the electronic device 100 according to an embodiment of the disclosure may include a display, a first cover surrounding one side of the display, a panel support disposed on one side of the display, a rotation shaft contacting the panel support, and a second cover coupled to the first cover and the rotation shaft, and other components may be added or excluded as necessary. In addition, at least one of the elastic members, magnetic force-related members (at least one of a magnetic material that reacts to magnetic force or a magnet), and gear structures described in FIGS. 4A to 8 may be selectively further added or excluded. The electronic device 100 described above may include an actuator, and may operate such that the second display region 160b is automatically expanded or reduced according to the actuator control. Alternatively, in the electronic device 100, as the second cover 182 is moved in the first direction (x-axis direction) by the external pressure applied to the second cover 182, the sliding structure 150 and the first rotation shaft 155, which are engaged with the second cover 182, may be rotated, which may, in turn, make the second display region 160b expanded or reduced in a manual manner.

Figure 4A:
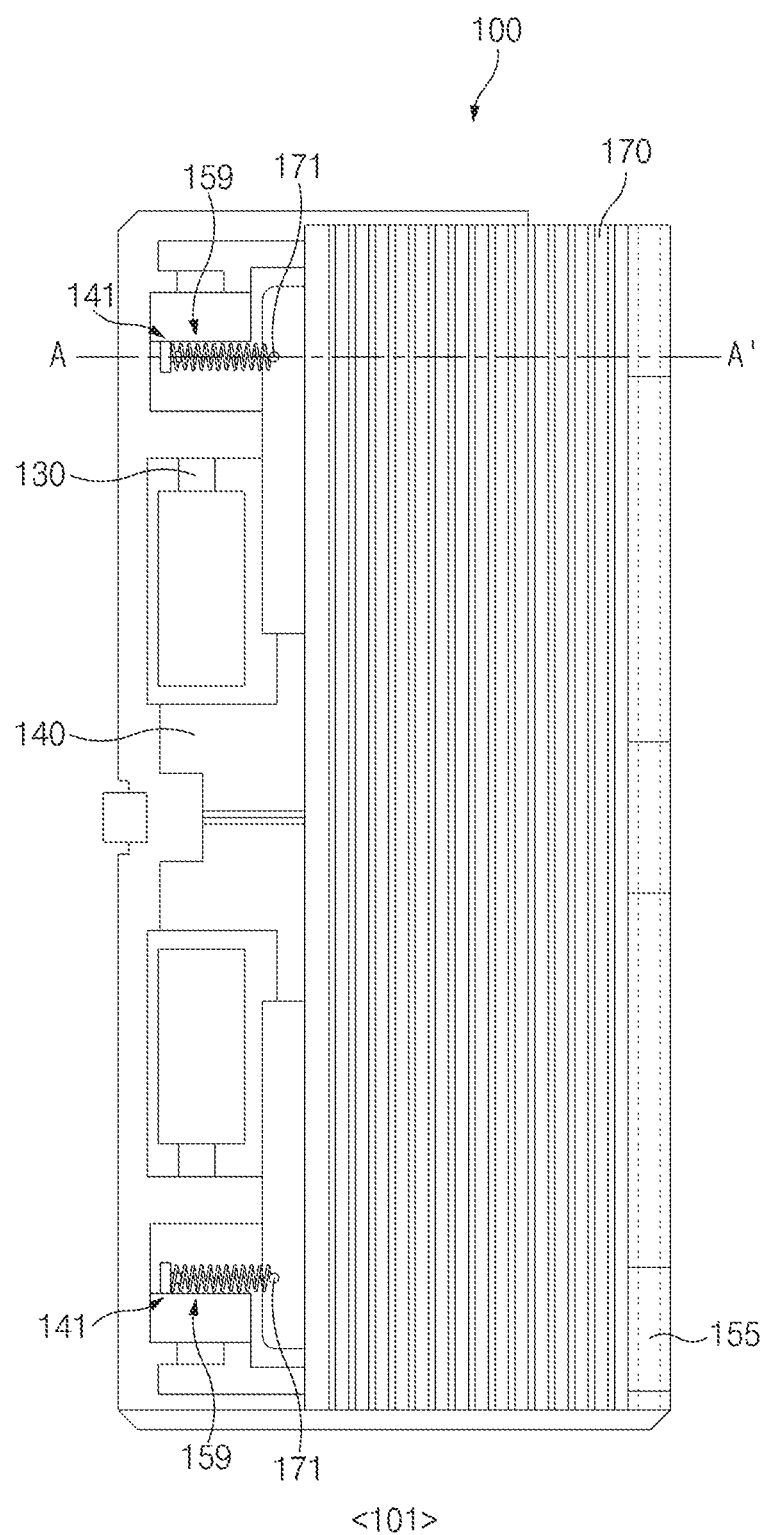
FIG. 4a is a diagram illustrating an exploded perspective view of components of an electronic device based on a second direction according to an embodiment of the disclosure.
Figure 4B:
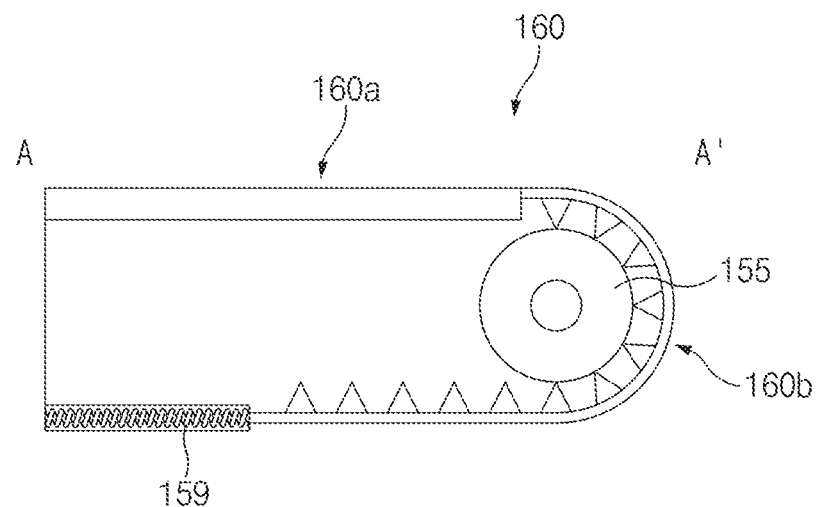
FIG. 4b is a diagram illustrating at least a portion of a cross section of an electronic device taken along line A-A' in FIG. 4a according to an embodiment of the disclosure.

FIG. 4A is a diagram illustrating a portion of an internal structure of an electronic device according to an embodiment of the disclosure. FIG. 4B is a diagram illustrating at least a portion of a cross-section of an electronic device taken along line A-A' of FIG. 4A according to an embodiment of the disclosure. Here, FIG. 4A is a diagram illustrating at least a portion of the back surface of the electronic device with the cover removed.

Referring to FIGS. 4A and 4B, the electronic device 100 according to an embodiment may include at least the first display support member 140, the first panel support 170, the actuator 130, and the first rotation shaft 155, and an elastic member 159. According to various embodiments of the disclosure, the electronic device 100 may further include the display 160, the first cover 181, and the second cover 182, as described above with reference to FIGS. 2 and 3.

On one side of the first display support member 140, a fixing groove 141 allowing one side of the elastic member 159 to be fixed may be disposed. For example, when the elastic member 159 is provided in a spring shape, at least a portion of the fixing groove 141 may have a ring shape on which one side of the elastic member is mounted to fix one side of the elastic member 159. The fixing groove 141 may also be provided in a hole shape including a ring.

One side of the elastic member 159 may be fixed to the first display support member 140, and the other side of the elastic member 159 may be fixed to one side of the first panel support 170. The elastic member 159 may have a stretched state. In this way, the stretched elastic member 159 may exert a greater elastic force to the first panel support 170. As the elastic force of the elastic member 159 acts such that one side end of the first panel support 170 is directed in the second direction (−x-axis direction), at least a portion of the display 160 and the first panel support 170 may maintain a predetermined flatness.

One or more elastic members 159 may be disposed based on at least one of the size of the first panel support 170 and the stretching characteristics of the first panel support 170 (e.g., the magnitude of the stretching force or the amount of the tension). For example, two elastic members 159 may be disposed on both side edges of the first panel support 170, respectively, as illustrated. Alternatively, one elastic member 159 may be disposed at a central position of the first panel support 170. Alternatively, three or more elastic members 159 may be connected to the first panel support 170. The elastic member 159 may be formed of at least one of various materials capable of providing an elastic force of a specified magnitude or more, such as spring and rubber.

The first panel support 170 may include connecting holes 171 through which the elastic member 159 is possible to be connected. As described above, the first panel support 170 may be constituted by a plurality of protrusions which are sequentially disposed. Among the plurality of protrusions, protrusions disposed on one side (e.g., an end in the −x-axis direction) may have a wider width than other adjacent protrusions in order to form the connecting holes 171. The number of connecting holes 171 may be formed to correspond to the number of elastic members 159. For example, if a plurality of the elastic members 159 are disposed, a plurality of the connecting holes 171 may also be disposed.

Figure 5:
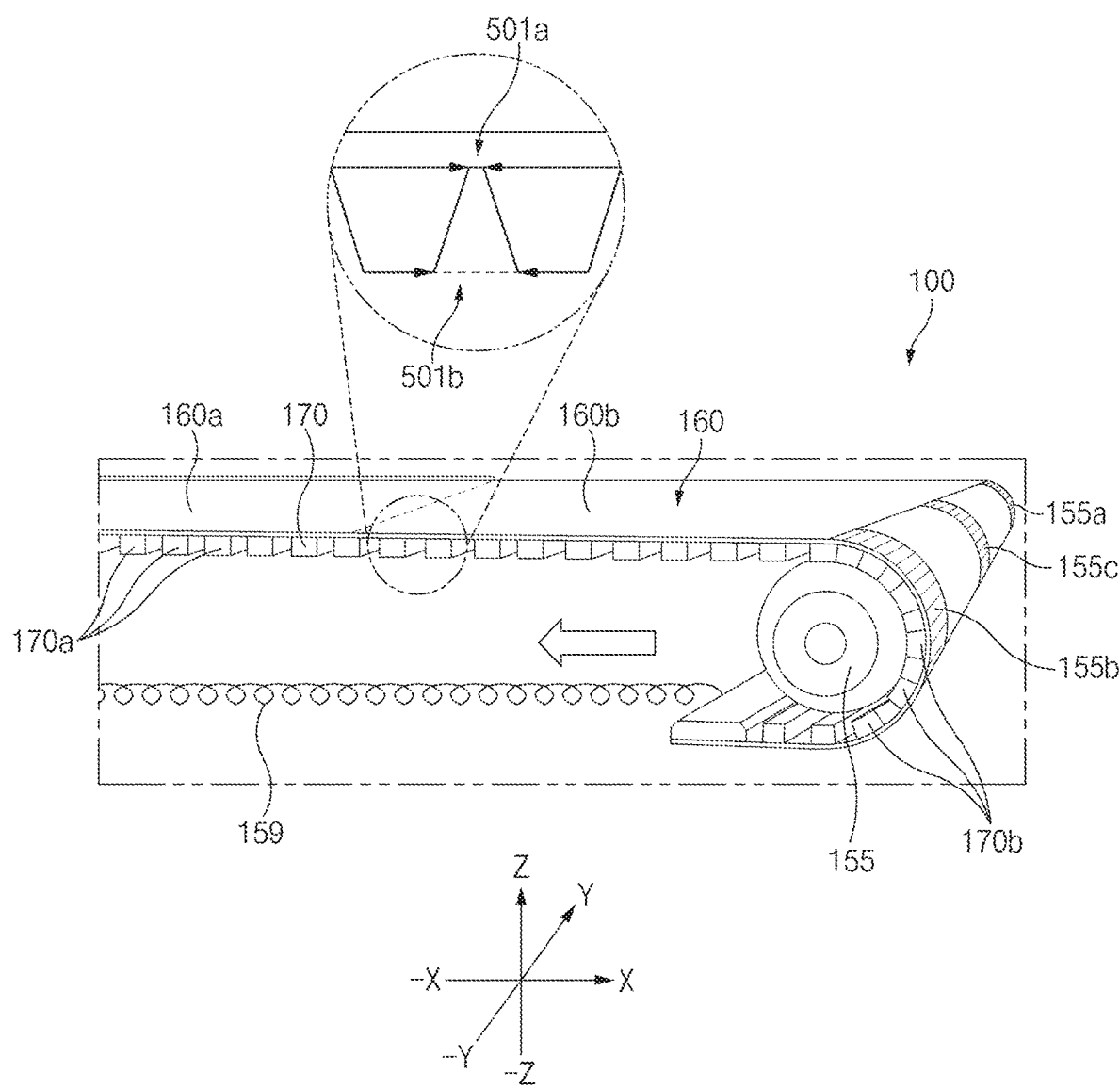
FIG. 5 is a diagram illustrating a portion of configuration of an electronic device related to maintenance of flatness according to an embodiment of the disclosure.

FIG. 5 is a diagram illustrating a portion of a configuration of an electronic device related to maintenance of flatness according to an embodiment of the disclosure.

Referring to FIG. 5, the electronic device 100 according to an embodiment may include the display 160, the first panel support 170, and the first rotation shaft 155. FIG. 5 illustrates only a portion of the configuration of the electronic device 100, and may further include at least some of other configurations of the electronic device described with reference to FIGS. 2 and 3.

The display 160 may correspond to the display 160 described with reference to FIGS. 1 to 3. For example, the display 160 may include the first display region 160*a* whose disposition state is fixed regardless of sliding of the second cover 182, and the second display region 160*b* whose the disposition state is changed with sliding of the second cover 182.

The first panel support 170 may be disposed under the second display region 160*b* of the display 160 to support the second display region 160*b*. The first panel support 170 may include a plurality of protrusions 170*a*, . . . , and 170*b*. The plurality of protrusions 170*a*, . . . , and 170*b* may be formed such that the upper surface (the surface facing the second display region 160*b*) and the lower surface (the surface opposite to the second display region 160*b*) have the same area. In this case, the plurality of protrusions 170*a*, . . . , and 170*b* may be disposed to be spaced apart at certain intervals. According to various embodiments of the disclosure, in the plurality of protrusions 170*a*, . . . , and 170*b*, the upper surface may have a relatively wide surface as compared to the lower surface. In this case, the first gap 501*a* between individual upper surfaces of the plurality of protrusions 170*a*, . . . , and 170*b* may be formed to be smaller than a second gap 501*b* between individual lower surfaces. Corresponding to the movement of the second cover 182, the lower surfaces of the plurality of protrusions 170*a*, . . . , and 170*b* may move while contacting the first rotation shaft 155.

According to an embodiment of the disclosure, at least some of the plurality of protrusions 170*a*, . . . , and 170*b* included in the first panel support 170 may be formed of a magnetic material (e.g., an iron, an iron alloy, or an object magnetized to a magnet, which forms an attractive force in reaction to a magnetic force). According to an embodiment of the disclosure, among the plurality of protrusions 170*a*, . . . , and 170*b* of the first panel support 170, at least one protrusion disposed adjacent to the boundary between the first display region 160*a* and the second display region 160*b* may be formed of a magnetic material. Alternatively, a first protrusion group 170*a* (or at least one first protrusion) disposed close to the side edge of the first display region 160*a* in the first direction (x-axis direction) may be formed of a magnetic material. Accordingly, in the rolled state (e.g., the state 101 of FIG. 1), where the electronic device 100 is disposed such that only the first display region 160*a* is exposed, the first protrusion group 170*a* may maintain the contact state with the first rotation shaft 155. As the first protrusion group 170*a* maintains the contact state with the first rotation shaft 155 based on the magnetic force, the first display region 160*a* may maintain flatness within a specified size. In the illustrated drawing, the first protrusion group 170*a* and a second protrusion group 170*b* are illustrated in a form including a plurality of protrusions, respectively; however, the disclosure is not limited thereto. At least one of the first protrusion group 170*a* and the second protrusion group 170*b* may include a plurality of protrusions, respectively, or may include only one protrusion, respectively, and when the first protrusion group 170*a* (or the second protrusion group 170*b*) includes one protrusion, the second protrusion group 170*b* (or the first protrusion group 170*a*) may include a plurality of protrusions.

According to various embodiments of the disclosure, in an unfolded state (e.g., the state 103 of FIG. 1), where the electronic device 100 is disposed such that the first display region 160*a* and at least a portion of the second display region 160*b* are exposed together, the second protrusion group 170*b* including at least one protrusion disposed on one side edge of the second display region 160*b* (e.g., an end edge in the opposite direction based on a boundary with the first display region 160*a*) may maintain the contact state with the first rotation shaft 155. As the second protrusion group 170*b* maintains the contact state with the first rotation shaft 155 based on the magnetic force, the first display region 160*a* and the second display region 160*b* may maintain flatness within a specified range.

At least a portion of the first rotation shaft 155 may be in contact with at least some of the plurality of protrusions of the first panel support 170. The first rotation shaft 155 may rotate with the operation of the actuator 130. Alternatively, the first rotation shaft 155 may rotate with the movement of the second cover 182 in the x-axis direction. While the first rotation shaft 155 rotates, the positions of the protrusions of the first panel support 170 contacting the first rotation shaft 155 may be changed. At least a portion of the first rotation shaft 155 may be formed of a magnetic member (or permanent magnet or electromagnet). According to an embodiment of the disclosure, the first rotation shaft 155 may be provided in a cylindrical rod shape. The first rotation shaft 155 may at least partially include a magnet member that contacts an upper end (end in the y-axis direction) and a lower end (end in the −y-axis direction) of the second display region 160*b*. For example, in the first rotation shaft 155, at least one of a certain portion 155*a* disposed close to the end of the second display region 160*b* in the y-axis direction, a certain portion 155*b* disposed close to the end of the second display region 160*b* in the −y-axis direction, and the central part 155*c* of the second display region 160*b* may include a magnet member of a specified size.

According to various embodiments of the disclosure, the first rotation shaft 155 may be provided in a cylindrical rod shape, may include a coil wound a certain number of times on the inner side, and may become an electromagnet by using electric power supplied from a battery of the electronic device 100. According to an embodiment of the disclosure, the processor of the electronic device 100 may perform control such that at least a portion of the first rotation shaft 155 becomes an electromagnet by supplying electric power to the first rotation shaft 155 in at least one of a state in which the second display region 160*b* is wound (e.g., the state 101 in FIG. 1) and a state in which the second display region 160*b* is unfolded (e.g., the state 103 of FIG. 1). Accordingly, the first panel support 170 including a plurality of protrusions, at least a portion of which is formed of a magnetic material, contacts the first rotation shaft 155 based on the magnetic force in the state 101 and the state 103, respectively, thereby making it possible to maintain the flatness of the specified size.

In the illustrated drawing, the plurality of protrusions are divided into the first protrusion group 170*a* and a second protrusion group 170*b*; however, the number of protrusions belonging to each protrusion group is not limited. For example, the first protrusion group 170*a* may include protrusions disposed relatively close to the first display region 160*a*, and the second protrusion group 170*b* may include protrusions disposed relatively far away from the first display region 160*a*. The first protrusion group 170*a* and the second protrusion group 170*b* may be described as including all the plurality of protrusions, or additional protrusions may be disposed between the first protrusion group 170*a* and the second protrusion group 170*b*. According to various embodiments of the disclosure, in a state in which a portion of the display 160 is wound (e.g., a state before the sliding of the second cover 182 for expanding the display region), protrusions at least partially contacting the first rotation shaft 155 may belong to the first protrusion group 170*a*. Accordingly, the number of protrusions belonging to the first protrusion group 170*a* may be changed according to the size of the first rotation shaft 155 or the size of the protrusions and the interval between the protrusions.

The first panel support 170 described with reference to FIG. 5 may further include at least one elastic member 159, which has been described with reference to FIGS. 4A and 4B. In this case, as the elastic member 159 pulls the first panel support 170 in the second direction (−x-axis direction), the lifting of the second display region 160*b* is eliminated (or the bending repulsion is eliminated), and thus the display 160 may maintain flatness within a specified size. In this state, at least one of the plurality of protrusions contacts the first rotation shaft 155 by magnetic force, and as a result, the flatness of the display 160 may be further enhanced in addition to the elasticity of the elastic member 159.

Meanwhile, an example has been described above in which, among the plurality of protrusions included in the first panel support 170, the first protrusion group 170*a* disposed close to the first display region 160*a* and the second protrusion group 170*b* disposed far away from the first display region 160*a* (or relatively close to the elastic member 159) are formed of a magnetic material; however, the disclosure is not limited thereto. For example, all the protrusions included in the first panel support 170 may be formed of a magnetic material, or when a protrusion disclosed closet to the first display region 160*a* among a plurality of continuously disposed protrusions is designated as first, odd-numbered (or even-numbered) or the N-th protrusions may be formed of a magnetic material and the remaining protrusions may be formed of a non-magnetic material. In addition, the first rotation shaft 155 may be formed of a magnetic material, and at least some of the plurality of protrusions disposed on the first panel support 170 may be formed of a magnetic member (e.g., permanent magnet).

According to various embodiments of the disclosure, at least a portion of at least one of the first rotation shaft 155 and the first panel support 170 may be provided as a magnetic member (e.g., a magnet), and at least a portion of at least one of the rests one may be a magnetic material that generates an attractive force with the magnetic material. For example, if at least a portion of the first rotation shaft 155 is formed of a magnetic member, at least a portion of the first panel support 170 may be formed of a magnetic material. Alternatively, at least one of the protrusions constituting the first panel support 170 or at least some of specific protrusions may be formed of a magnetic material. Alternatively, if at least a portion of the first rotation shaft 155 is formed of a magnetic material, at least a portion of the first panel support 170 may be formed of a magnetic member. Alternatively, at least portions of the first rotation shaft 155 and the first panel support 170 may be all a magnetic member.

Figure 6:
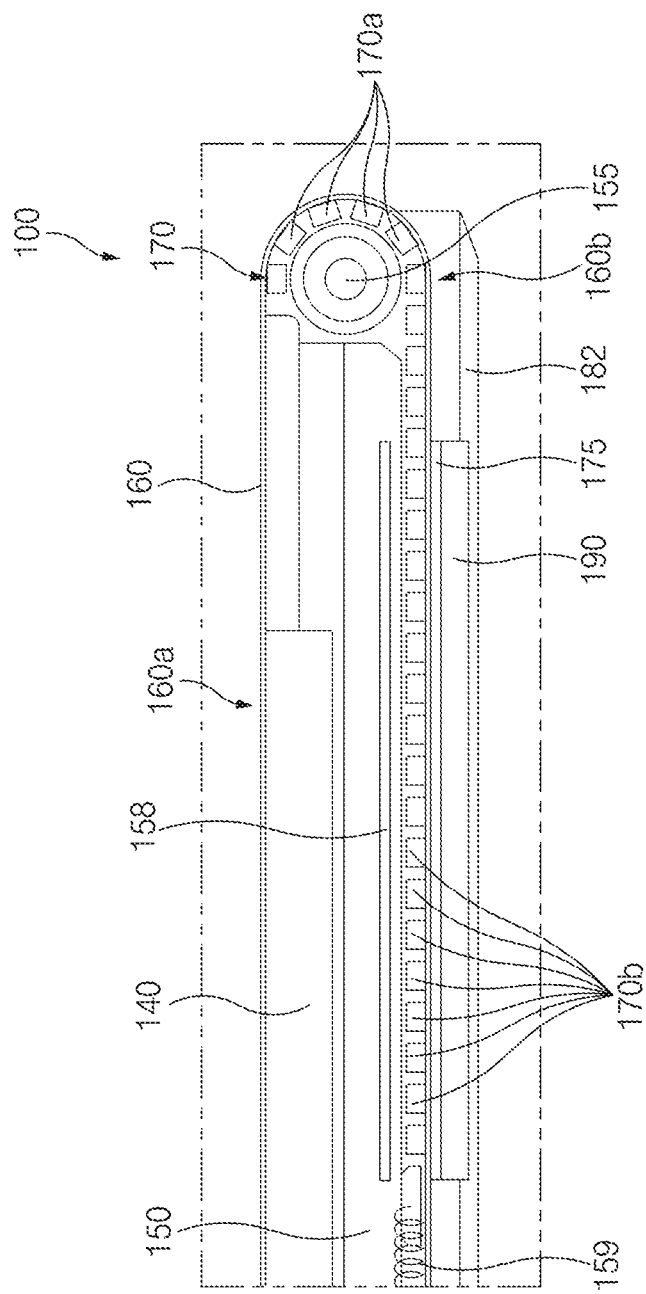
FIG. 6 is a diagram illustrating a portion of configuration of an electronic device related to prevention of display damage according to an embodiment of the disclosure.

FIG. 6 is a diagram illustrating a portion of a configuration of an electronic device related to prevention of display damage according to an embodiment of the disclosure.

Referring to FIG. 6, the electronic device 100 according to an embodiment may include the display 160, the first display support member 140, the sliding structure 150, the first panel support 170, and the first rotation shaft 155, the second cover 182, the elastic member 159, and the first magnetic force-related member 158. Furthermore, the electronic device 100 may further include the first cover 181 and the protective member 175.

The display 160 may include the first display region 160*a* and the second display region 160*b*. When the electronic device 100 is in the state of being wound (e.g., the state 101 of FIG. 1 or the state before the sliding of the second cover 182 for expanding the display 160), the first display region 160*a* may include, for example, as illustrated, a region exposed upward (e.g., in the z-axis direction), and the second display region 160*b* may include a region disposed between the sliding structure 150 and the second cover 182. The first protrusion group 170*a* disposed at one side end of the first panel support 170 (e.g., a left region of the second display region 160*b*, (e.g., a region disposed adjacent to the first display region 160*a*)) may be disposed to be in contact with the first rotation shaft 155. Here, at least one of the one or more protrusions included in the first protrusion group 170*a* may be formed of a magnetic material, and the first rotation shaft 155 may be formed of a magnet member. Alternatively, at least one of one or more protrusions included in the first protrusion group 170*a* may be formed of a magnetic member and the first rotation shaft 155 may be formed of a magnetic material, as described above with reference to FIG. 5.

The first magnetic force-related member 158 is disposed on one side of the sliding structure 150, and, may be disposed at a position adjacent to the back portion of the first panel support 170 in a wound state. The first magnetic force-related member 158, may include, for example, a member capable of generating an attractive force to at least some of the plurality of protrusions included in the first panel support 170 (e.g., the second protrusion group 170*b*). According to an embodiment of the disclosure, the first magnetic force-related member 158 may be formed of a permanent magnet. The first magnetic force-related member 158 may move the second display region 160*b* upward (e.g., the z-axis direction) while the second display region 160b is disposed between the sliding structure 150 and the second cover 182, which makes it possible to prevent at least a portion of the second display region 160b from contacting the second cover 182. Accordingly, the electronic device 100 may prevent the second display region 160b from being damaged by the second cover 182. In this regard, at least some of the plurality of protrusions (e.g., the second protrusion group 170b) disposed in the second display region 160b may be provided in a configuration capable of forming an attractive force to the first magnetic force-related member 158 (e.g., a magnetic material (an object that forms an attractive force in reaction to magnetic force) or a magnet (an object that directly generates magnetic force)). In the above description, the second protrusion group 170b may include at least some of the remaining protrusions other than those of the first protrusion group 170a.

The elastic member 159 pulls the second display region 160b in a second direction (−x-axis direction), thereby providing tension to the second display region 160b while reducing friction between the second display region 160b and the second cover 182, which makes it possible to provide support such that the display region of the part on which the first rotation shaft 155 is disposed has a flatness of a specified size or more.

The protective member 175 may be disposed between the sliding structure 150 and the second cover 182 or between the second display region 160b and the second cover 182. Alternatively, the protective member 175 is formed on at least a portion of the inner surface of the second cover 182 (e.g., a surface observed in the z-side direction), and may be disposed in a region facing the second display region 160b. The protective member 175 may protect at least a portion of the second display region 160b when the display 160 of the electronic device 100 is wound (e.g., the state 101 of FIG. 1). The protective member 175 may be formed of a material having a friction force equal to or less than a specified size, such as velvet, leather, paper, and wool. At least one component 190 (e.g., battery or printed circuit board (PCB)) related to driving the electronic device 100 may be disposed under the protective member 175 (e.g., in the −z-axis direction). According to various embodiments of the disclosure, the at least one component 190 related to driving the electronic device 100 may be disposed in the inner side of the sliding structure 150. The protective member 175 may be disposed between the second display region 160b and the at least one component 190 of the electronic device, which makes it possible to prevent at least one of damage to the second display region 160b or damage to the at least one component 190 of the electronic device, caused by friction between the second display region 160b and the at least one component 190 of the electronic device.

Figure 7:
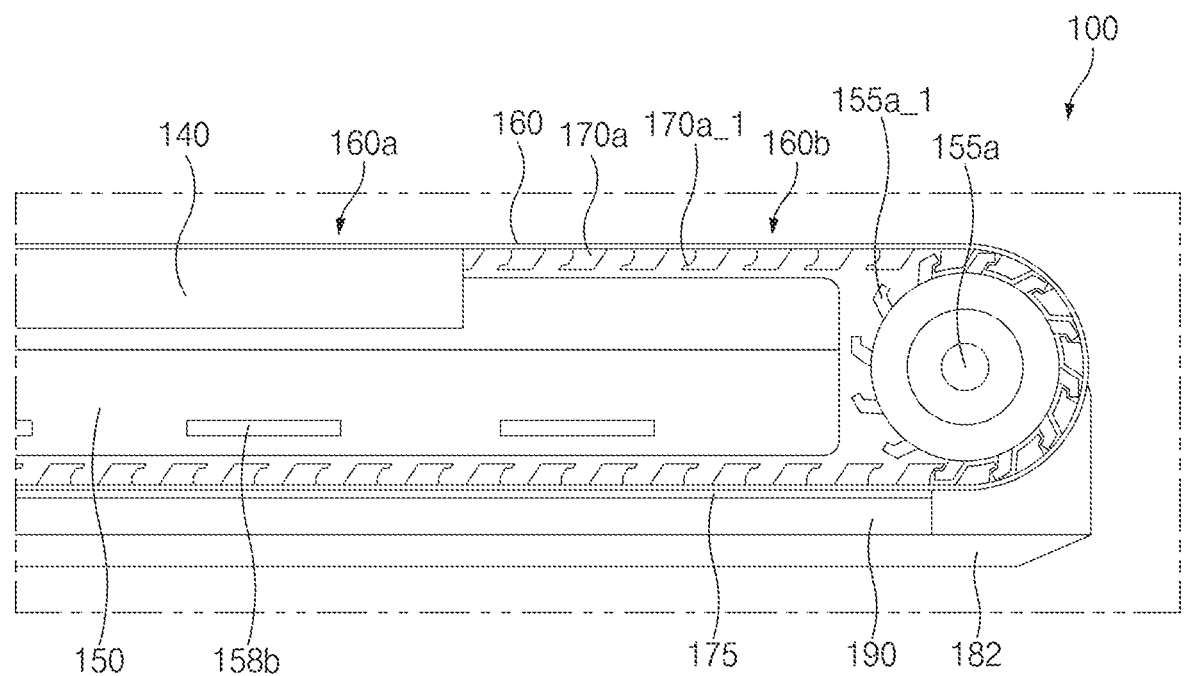
FIG. 7 is a diagram illustrating a portion of electronic device related to maintenance of flatness according to an embodiment of the disclosure.
Figure 7:
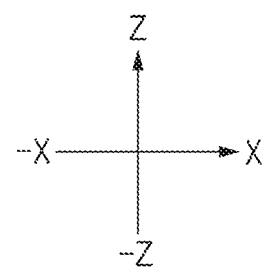

FIG. 7 is a diagram illustrating a portion of a configuration of an electronic device related to maintenance of flatness according to an embodiment of the disclosure.

Referring to FIG. 7, the electronic device 100 according to an embodiment may include the first display support member 140, the sliding structure 150, the display 160, a second panel support 170a, a second rotation shaft 155a, and a second magnetic force-related member 158a. Alternatively, the electronic device 100 may further include the protective member 175. According to various embodiments of the disclosure, the electronic device 100 may further include at least one of the components described with reference to FIGS. 1 to 3. According to various embodiments of the disclosure, the protective member 175 may be disposed between the second display region 160b and the at least one component 190 of the electronic device, which makes it possible to prevent damage caused by friction between the second display region 160b and the at least one component 190 of the electronic device.

The display 160 may include, for example, the first display region 160a whose position is fixed, and the second display region 160b whose position is changed. An upper surface (e.g., a surface directed to the z-axis) of the first display support member 140 may be disposed under the display 160. Alternatively, the second panel support 170a including at least one protrusion may be disposed under the second display region 160b of the display 160.

The lower surface of each protrusion included in the second panel support 170a (e.g., the surface directed to the −z axis) may include a hook pattern. The hook pattern may include a hook ring 170a_1 protruding in a direction opposite to the protruding direction of the hook pattern formed on the second rotation shaft 155a. According to an embodiment of the disclosure, the hook ring 170a_1 of the second panel support 170a may be disposed in the second direction (−x axis) based on the upper surface (e.g., the surface exposed in the z-axis) of the second display region 160b. According to various embodiments of the disclosure, when the second display region 160b is disposed between the second cover 182 and the sliding structure 150, the hook ring 170a_1 of the second panel support 170a disposed in the second display region 160b may be disposed to be directed in the first direction (the x-axis direction). The hook ring 170a_1 may be formed on one side of the lower surface of the corresponding protrusion.

The second rotation shaft 155a is provided in a cylindrical rod shape, and at least one hook pattern 155a_1 may be regularly disposed on the outer surface at certain intervals. The hook pattern 155a_1 may be formed to correspond to the hook ring 170a_1 formed on the second panel support 170a. According to various embodiments of the disclosure, the hook pattern 155a_1 may be partially disposed on the second rotation shaft 155a. For example, the hook pattern 155a_1 may be formed on at least one of one side edge, the other side edge, and the center of the second rotation shaft 155a provided in a cylindrical rod shape.

The second magnetic force-related member 158a may play the same role as the first magnetic force-related member 158 described above with reference to FIG. 6. For example, the second magnetic force-related member 158a may be disposed adjacent to the second panel support 170a, and may generate an attractive force to at least one of the plurality of protrusions disposed on the second panel support 170a. In this regard, the second magnetic force-related member 158a may be provided as a magnet or a magnetic material, and at least a portion of the second panel support 170a may be provided as a magnetic material or a magnet. Alternatively, both the second magnetic force-related member 158a and the second panel support 170a may be formed of a magnet. The second magnetic force-related member 158a may include a plurality of magnetic materials or magnets spaced apart at specified intervals. The second magnetic force-related member 158a may be provided in a plate shape with a relatively long length in the longitudinal direction (e.g., the longitudinal direction of the rod of the second rotation shaft 155a).

In the electronic device 100 having the above-described structure, the second panel support 170a and the second rotation shaft 155a may be temporarily ring-coupled in the process of contacting each other, making them to come into close contact with each other. Accordingly, as the second panel support 170a maintains a stable contact state with the second rotation shaft 155a, the second display region 160b in the vicinity of the second rotation shaft 155a does not protrude or bend outward (e.g., z-axis direction), and thus flatness may be kept constant.

Meanwhile, in the above description, the shape of the hook pattern 155a_1 protruding from the surface of the cylindrical rod is illustrated; however, the disclosure is not limited thereto. For example, the hook pattern 155a_1 may include hook grooves (or recesses) that are cut into a surface of the outside of the cylindrical rod. At least some of the hook grooves may be temporarily coupled to hook rings disposed on the panel support while the display 160 is expanded or returned to its original state. Alternatively, when the expansion or reduction of the display 160 is stopped, at least some of the hook holes may maintain a fastened state with the hook rings of the panel support.

Figure 8:
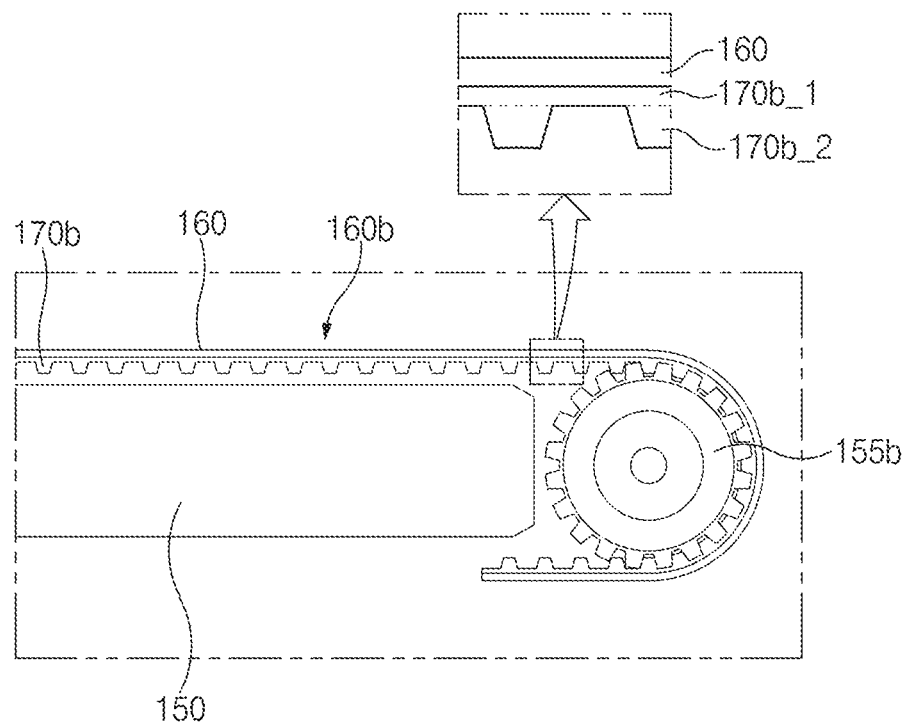
FIG. 8 is a diagram illustrating a portion of a configuration of an electronic device related to maintenance of flatness according to an embodiment of the disclosure.

FIG. 8 is a diagram illustrating a portion of a configuration of an electronic device related to maintenance of flatness according to an embodiment of the disclosure.

Referring to FIG. 8, the electronic device 100 according to an embodiment may include the sliding structure 150, a third panel support 170b, and a third rotation shaft 155b. Furthermore, the electronic device 100 may further include at least one of the components of the electronic device 100 described with reference to FIGS. 1 to 3.

The third panel support 170b may include peaks protruding at a specified interval and troughs recessed at a specified interval, below the display 160. In the third panel support 170b, for example, a substrate portion 170b_1 and protrusions 170b_2 may be integrated with each other. For example, at least a portion of the third panel support 170b may be formed of a rubber material or a polymer material. As the substrate portion 170b_1 of the third panel support 170b maintains a constant thickness, it is possible to prevent the issue that the third panel support 170b is viewed when the display 160 is seen from the outside of the second display region 160b (in the z-axis direction). For example, as described with reference to FIG. 7, when the gear patterns are disposed at certain intervals directly on a lower portion of the display 160, the certain intervals are visually recognized as a stripe when viewed from the outside, which may result in deterioration in quality of the display 160 in uniformity. As in the third panel support 170b illustrated in FIG. 8, if the protrusions 170b_2 are integrally formed with the substrate portion 170b_1, the above-mentioned uniformity quality may be improved.

The third rotation shaft 155b may be provided in a form corresponding to the pattern of the protrusions 170b_2 of the third panel support 170b. For example, the third rotation shaft 155b may be provided in a cylindrical rod shape, and a plurality of stripe-shaped protrusions may be disposed on the rod surface. The plurality of stripe-shaped protrusions may be partially formed for each position of the rod.

According to various embodiments of the disclosure, at least portions of the third panel support 170b and the third rotation shaft 155b may have magnetism. For example, at least portions of the third panel support 170b and the third rotation shaft 155b may be formed of a rubber magnet. Based on this, as the third panel support 170b comes in close contact to the third rotation shaft 155b by magnetic force, the bending of the third panel support 170b on the part of the third rotation shaft 155b is removed, which makes it possible to maintain the flatness of the display 160.

According to various embodiments described, the electronic device according to an embodiment may include a first cover (e.g., 181 of FIG. 1), a second cover (e.g., 182 of FIG. 1) coupled to the first cover to slide, a display (e.g., 160 of FIG. 1) in which a size of an exposed region is changed corresponding to the movement of the second cover, a panel support (e.g., 170 of FIG. 1) disposed on one side of a back surface of the display based on a front surface of the display on which a screen is displayed, and a rotation shaft (e.g., 155 of FIG. 1) contacting at least a portion of the panel support and rotating corresponding to the movement of the second cover, and an attractive force may be formed between the rotation shaft and at least a portion of the panel support.

According to various embodiments of the disclosure, at least some of the plurality of protrusions may be an object (e.g., a magnetic material or a magnet) that reacts to magnetic force, and at least a portion of the rotation shaft may be an object (e.g., a magnet or a magnetic material) that forms an attractive force with at least a portion of the plurality of protrusions, and thus the portion of the rotation shaft may contact the portion of the plurality of protrusions based on the attractive force.

According to various embodiments of the disclosure, in a state in which a portion of the display (e.g., the second display region 160b of FIG. 2) is wound (or the state before the sliding of the second cover for expanding the display region), at least a portion of the protrusions in contact with the rotation shaft among the plurality of protrusions disposed in the panel support may be a material that forms an attractive force with at least a portion of the rotation shaft.

According to various embodiments of the disclosure, in a state in which the display is unfolded (or a state in which at least a portion of the second display region 160b is disposed side by side with the first display region 160a, a state in which the second cover has slid for expanding the display region), among the plurality of protrusions disposed in the panel support, at least some of the protrusions in contact with the rotation shaft may be made of a material that forms an attractive force with at least a portion of the rotation shaft.

According to various embodiments of the disclosure, at least some of the plurality of protrusions may be formed of a magnetic material or a ferromagnetic material that reacts to the magnetic force.

According to various embodiments of the disclosure, at least some of the plurality of protrusions may be formed of a permanent magnet.

According to various embodiments of the disclosure, a portion of the surface of the rotation shaft contacting the plurality of protrusions may be formed of a material that reacts to the magnetic force.

According to various embodiments of the disclosure, at least a portion of the rotation shaft may include a permanent magnet.

According to various embodiments of the disclosure, the display may include a first display region having a fixed disposition form, and a second display region in which an exposed region is changed with the movement of the panel support.

According to various embodiments of the disclosure, the rotation shaft may operate as an electromagnet depending on electric power supplied based on a coil disposed on an inner side.

According to various embodiments of the disclosure, the rotation shaft may operate as an electromagnet when the second display region is expanded to a maximum.

According to various embodiments of the disclosure, the rotation shaft may operate as an electromagnetic when the second display region is formed to a minimum.

According to various embodiments of the disclosure, the panel support may include a gear pattern in which the protrusions and troughs are repeated, and first protrusions (e.g., the hook ring 170a_1) protruding in a direction parallel with the display on at least one side of the protrusions.

According to various embodiments of the disclosure, the rotation shaft may include second protrusions (e.g., the hook pattern 155a_1) including a gear corresponding to the gear pattern of the panel support, and temporarily coupled with the first protrusions when contacting one side of the panel support.

According to various embodiments of the disclosure, the rotation shaft may include hook grooves that are temporarily coupled with the first protrusions when contacting one side of the panel support.

According to various embodiments of the disclosure, the electronic device may further include a protective member disposed between a cover (e.g., at least one of the first cover 181 and the second cover 182 of FIG. 1) and the panel support to protect a portion of the display panel.

According to various embodiments of the disclosure, the electronic device may further include an elastic member having one end fixed to one side inside the electronic device and the other end connected to an end of the panel support.

According to various embodiments of the disclosure, the panel support may include a substrate portion of a predetermined thickness disposed on the back surface of the display, and gear peaks repeatedly protruding by a predetermined height on the substrate portion.

According to various embodiments of the disclosure, at least a portion of the panel support may be formed of an elastic material.

According to various embodiments of the disclosure, the electronic device may further include a magnetic force-related member disposed at a position adjacent to the inner surface of the panel support.

According to various embodiments of the disclosure, the magnetic force-related member may be disposed between at least a portion of the first display region exposed outside in a state in which the display is wound and at least a portion of the second display region disposed inside the electronic device.

Figure 9:
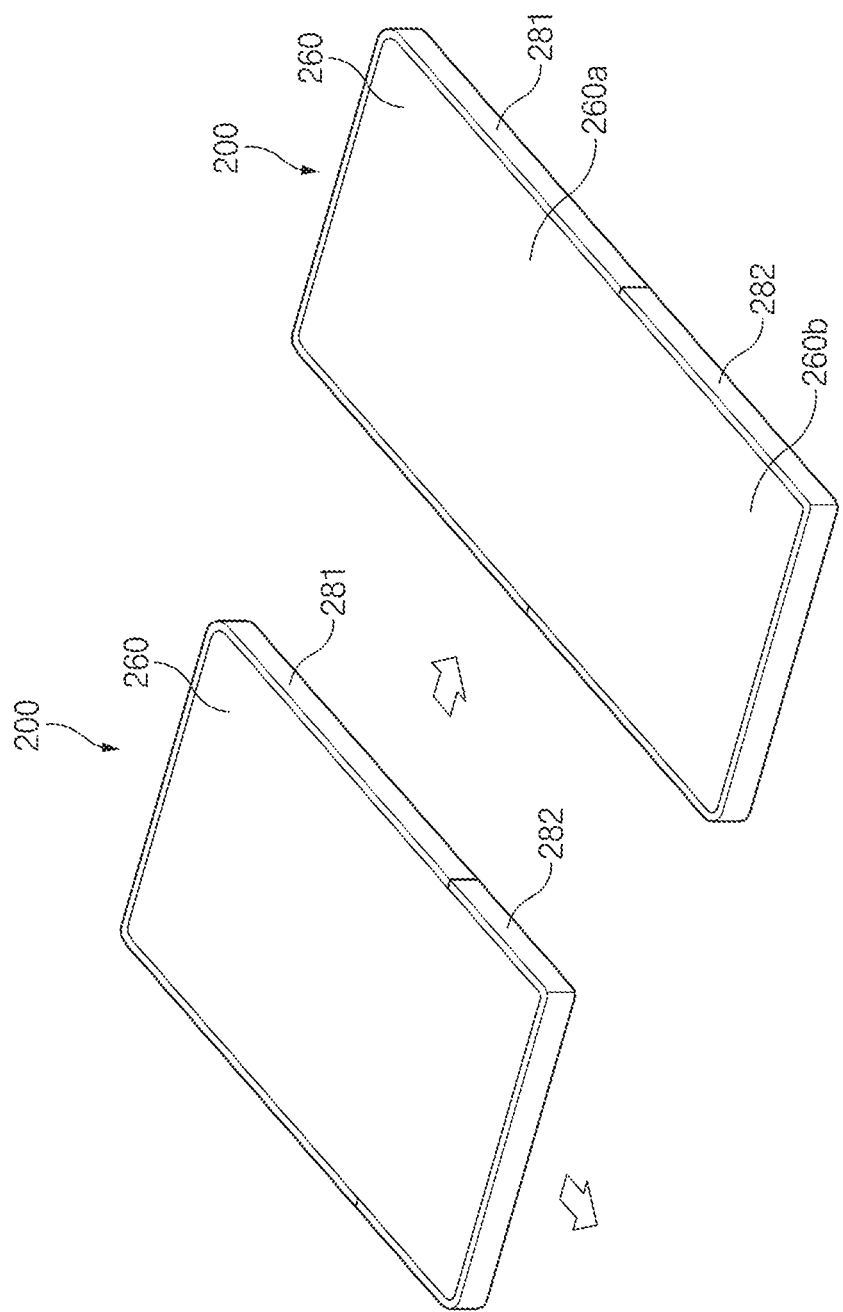
FIG. 9 is a diagram illustrating another structure of an electronic device related to maintenance of flatness according to an embodiment of the disclosure.

FIG. 9 is a diagram illustrating a structure of an electronic device related to maintenance of flatness according to an embodiment of the disclosure.

Referring to FIG. 9, an electronic device 200 according to an embodiment may include a first cover 281, a second cover 282, and a display 260. The second cover 282 may be moved in a vertical axis (e.g., an arrow direction in the illustrated drawing). In this case, as illustrated, the display 260 may be expanded and thus a second display region 260b may be secured in addition to an initial first display region 260a. The above-described electronic device 200 may employ structures of the panel support and the rotation shaft described above with reference to FIGS. 4A to 8. Accordingly, the electronic device 200 may be a roll-type electronic device capable of being expanded in a vertical direction. The electronic device 200 may further include at least one of the protective member, the magnetic force-related member, the panel support made of rubber or polymer, and the elastic member mentioned in the above drawings.

Figure 10:
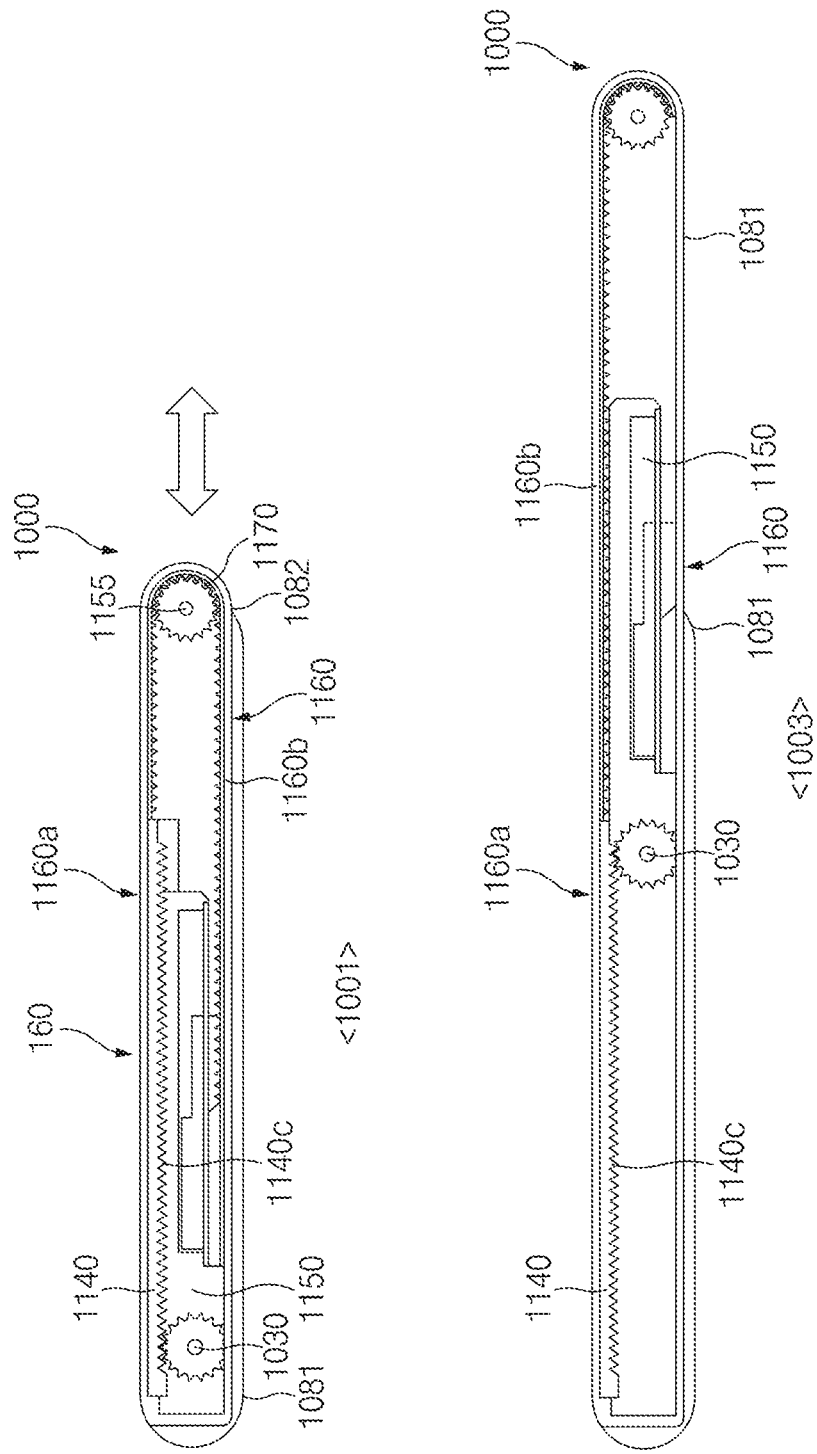
FIG. 10 is a diagram illustrating different structures of extension and reduction of an electronic device according to an embodiment of the disclosure.

FIG. 10 is a diagram illustrating different structures of extension and reduction of an electronic device according to an embodiment of the disclosure.

Referring to FIG. 10, an electronic device 1000 according to an embodiment may include at least a display 1160, a first cover 1081, a second cover 1082, a display support member 1140, a sliding structure 1150, a panel support 1170, a first driving unit 1030 (or configuration including the actuators described in FIGS. 2 and 3), and a second driving unit 1055 (or configuration including the rotation shaft described in FIGS. 2 and 3).

A display 1160 may have a configuration substantially the same as or similar to the display 160 described above with reference to FIGS. 2 and 3. For example, the display 1160 may be provided in a flexible form, may include a panel layer on which a screen is displayed and an outer protective layer (e.g., a polymer structure or ultra-thin glass) disposed over the panel layer, and additionally, may further include a touch panel layer. The display 1160 may include a first display region 1160a whose region size and position are fixed, and a second display region 1160b whose region size and position are changed. One side edge of the first display region 1160a and one side edge of the second display region 1160b may be continuously disposed. For example, the second display region 1160b may disposed to extend from one side edge of the first display region 1160a. The second display region 1160b may be disposed to be at least partially rolled into the inner side of the second cover 1082 or to be taken out from the inner side of the second cover 1082 to be directed in the same direction as the first display region 1160. The display support member 1140 may be disposed under the first display region 1160a, and the panel support 1170 may be disposed at a back surface of the second display region 1160b.

The first cover 1081 may include a bottom surface on which at least a portion of the sliding structure 1150 is seated and sidewalls disposed to surround side edges of the sliding structure 1150. The first cover 1081 may have substantially the same configuration as the first cover 181 described above with reference to FIGS. 2 and 3. The first cover 1081 may have an open state in the first direction (e.g., the right direction in the illustrated drawing), and the second cover 182 may be coupled to the first cover 1081 in the first direction so as to be slidable.

The second cover 1082 may be coupled to the first cover 1081 in the first direction. The second cover 1082 may have substantially the same configuration as the second cover 182 described above with reference to FIGS. 2 and 3. For example, the second cover 1082 may include a bottom surface on which at least a portion of the sliding structure 1150 is seated and sidewalls surrounding the side surfaces of the sliding structure 1150. The second cover 1082 may be moved in a first direction or in a second direction opposite to the first direction (e.g., the left direction based on the illustrated drawing) in a state in which the sliding structure 1150 is seated. In this case, the disposition form or position of the second cover 1082 may be changed according to the operations of the first driving unit 1030 and the second driving unit 1055.

The display support member 1140 may have a specified rigidity and may support the display 1160. For example, as at least a portion of the surface of the display support member 1140 facing the display 1160 is formed to be flat, the display support member 1140 may be disposed to face the back surface of the display 1160. At least a portion of the display support member 1140 may be seated and fixed in the first cover 1081. For example, the display support member 1140 may be disposed and fixed between the first cover 1081 and the back surface of the display 1160. At least a portion of such a display support member 1140 may be formed of a metal material (e.g., aluminum or aluminum alloy). According to an embodiment of the disclosure, at least a portion of the display support member 1140 may be provided as an injection material (e.g., a structure containing magnesium). In a state 1001, a first surface of the display support member

1140 (e.g., a surface facing the back surface of the display 1160) may be disposed to face the back surface of the first display region 1160*a*, and a second surface of the display support member 1140 opposite to the first surface of the display support member 1140 may be disposed to face the upper surface of the sliding structure 1150. The display support member 1140 may be provided to have a cross section of an "L" shape which is rotated by 90 degrees in the counterclockwise direction.

At least one guide rail 1140*c* may be formed on the back surface of the display support member 1140 (e.g., at least a portion of the display support member 1140 facing the first driving unit 1030). The at least one guide rail 1140*c* may be provided in a repeated pattern of peaks and troughs of a gear having a predetermined length on the back surface of the display support member 1140. At least a portion of a ring gear of the first driving unit 1030 having gear grooves on the outer surface may be seated on the at least one guide rail 1140*c*. The at least one guide rail 1140*c* may be disposed on at least a portion of the back surface of the display support member 1140 (e.g., a surface opposite to the surface directed toward the display 1160). For example, two guide rails may be disposed biasedly toward both edges of the display support member 1140. The width of the at least one guide rail 1140*c* may have a size corresponding to the width of the ring gear of the first driving unit 1030 (e.g., size equal to or greater than the size of the ring gear). The length of the at least one guide rail 1140*c* may have a length corresponding to the maximum extension length of the second cover 1082.

At least a portion of the sliding structure 1150 may be coupled with the second cover 1182, and may be slid with the sliding of the second cover 1182. Alternatively, the sliding structure 1150 may be moved by the operation of the first driving unit 1030. In this regard, a separate physical button capable of instructing the driving of the first driving unit 1030 may be disposed in the electronic device 1000 or a menu related to driving the first driving unit 1030 may be output on the display screen of the display 1160. As at least a portion of the sliding structure 1150 is moved in the first direction as in a state 1003 while the second cover 1182 is moved in the first direction, the disposition direction of the second display region 1160*b* of the display 1160 fixed to the sliding structure 1150 may be changed from a display back surface direction (e.g., a direction opposite to the direction in which the first display region 1160*a* is directed) to a display front surface direction (e.g., a direction in which the first display region 1160*a* is directed).

The sliding structure 1150 may be disposed between the display support member 1140 and the first cover 1081 or at least partially side by side with the display support member 1140, and may have at least some of various structures related to driving the electronic device 1000 disposed inside. For example, a portion of the sliding structure 1150 may have an upper surface facing the back surface of the display support member 1140, and may have at least one of a battery, a printed circuit board, a camera, and a sensor disposed inside. The sliding structure 1150 may move together with the second cover 1082 in the first direction or in the second direction opposite to the first direction, with the operation of the first driving unit 1030. The sliding structure 1150 may have the same structure as at least a portion of the sliding structure 1150 described above with reference to FIGS. 2 and 3.

The panel support 1170 may have a shape in which a plurality of protrusions (or pillars, long bars, or slates) having a predetermined length in the third direction, which is opposite to the direction in which the first display region 1160*a* is directed, are disposed at certain intervals. At least a portion of the panel support 1170 may form a track, and may move (or slide) a portion of the display (e.g., the second display region 1160*b*) disposed on the track. The plurality of protrusions constituting the panel support 1170 may be disposed such that the surface facing the back surface of the display 1160 is flat, and the part disposed to be directed toward the inner side of the sliding structure 1150 (e.g., the part contacting the gear pattern of the second driving unit 1055) may be formed to protrude. For example, on the lower surface (e.g., one surface of the protrusions facing the sliding structure 1150) of the panel support 1170, peaks and troughs of the gear may be repeatedly formed. Among the plurality of protrusions constituting the panel support 1170, protrusions disposed at the position facing the gear pattern of the second driving unit 1055 may be disposed to be spaced apart from neighboring protrusions at certain intervals. The panel support 1170 may include a connecting chain or connecting shaft connecting a plurality of protrusions. As described above, at least one of the plurality of protrusions of the panel support 1170 may be provided as a material that reacts to magnetic force (e.g., a magnetic material (an object that forms an attractive force in reaction to magnetic force) or a magnet).

The first driving unit 1030 may generate power by receiving electric power from a battery included in the electronic device 1000. The first driving unit 1030 may be at least partially coupled to the at least one guide rail 1140*c* formed on the back surface of the display support member 1140, and may use the generated power to make the gear work for movement along the at least one guide rail 1140*c* in the first direction (or the second direction opposite to the first direction). The first driving unit 1030 may operate in conjunction with the second driving unit 1055. For example, at least some operations of the first driving unit 1030 may include an operation of rotating the gear in the same direction as the second driving unit 1055.

The second driving unit 1055 may be disposed to be at least partially coupled to the panel support 1170. Accordingly, at least a portion of the second driving unit 1055 may be disposed under the display 1160 and an operation for extending and winding the second display region 1160*b* may be performed. In this regard, at least a portion of the second driving unit 1055 may include a gear pattern, and the gear pattern may be coupled (or fastened) to at least a portion of the panel support 1170. The second driving unit 1055 may receive electric power from a battery, rotate a body including the gear pattern, and move the panel support 1170 coupled (or fastened) to the gear pattern in the first direction or the second direction, thereby making it possible to control the extension and reduction of the second display region 1160*b*. The second driving unit 1055 may operate in conjunction with the first driving unit 1030. For example, at least some operations of the second driving unit 1055 may operate in the same direction as some operations of the first driving unit 1030.

As described above, the electronic device 1000 according to an embodiment may include the first driving unit 1030 and the second driving unit 1055, and while the electronic device 1000 changes from the state 1001 to the state 1003, the first driving unit 1030 may rotate in a first rotation direction (e.g., a rotating direction causing the second cover 1082 to move in the first direction) and the second driving unit 1055 may also rotate in the first rotation direction in the same manner. Accordingly, the electronic device 1000 more stably extends the second cover 1082 by receiving the force required for the extension of the second cover 1082 from the first driving unit 1030 and the second driving unit 1055. Similarly for the first driving unit 1030 and the second driving unit 1055, in the process of the electronic device 1000 returning from the state 1003 to the state 1001, while the first driving unit 1030 rotates in the second rotation direction opposite to the first rotation direction, the second driving unit 1055 may also rotate in a second rotation direction. Accordingly, the electronic device 1000 according to an embodiment may provide enough power to move the second cover 1082 while changing from the extended state to the reduced state, thereby making it possible to provide more stable support for winding of the display 1160 and moving of the second cover 1082.

Figure 11:
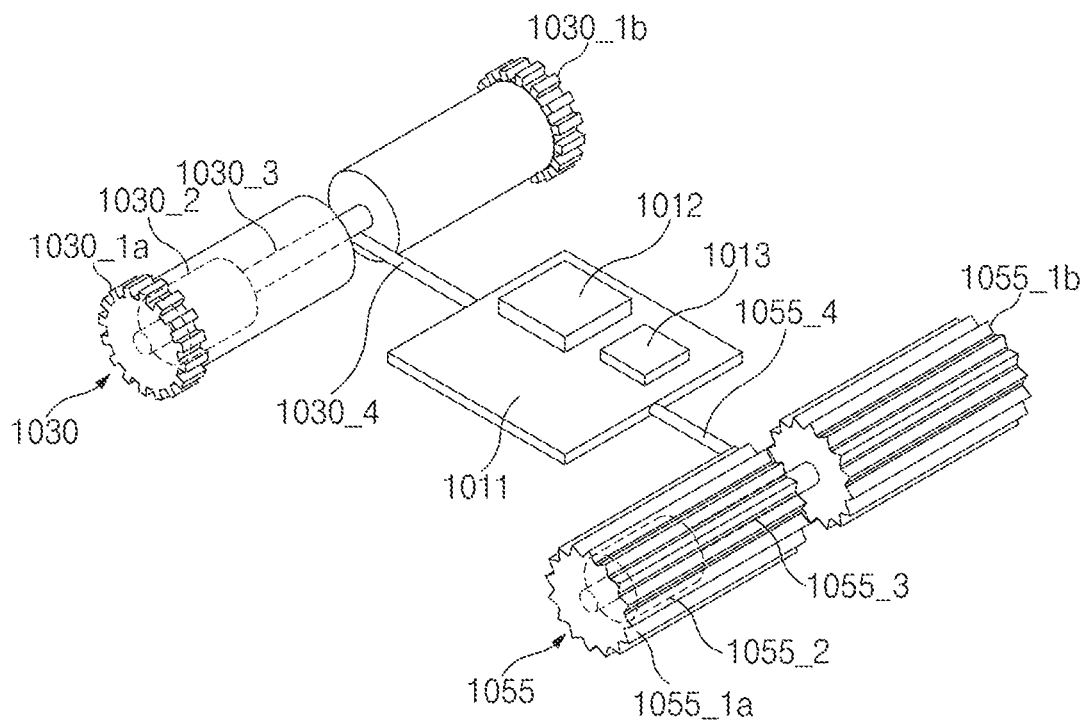
FIG. 11 is a diagram illustrating at least some of components related to a driving unit among components of an electronic device according to an embodiment of the disclosure.

FIG. 11 is a diagram illustrating at least some of components related to driving units among components of an electronic device according to an embodiment of the disclosure.

Referring to FIG. 11, the electronic device 1000 according to an embodiment may include the first driving unit 1030, the second driving unit 1055, a printed circuit board 1011, a processor 1012, and a memory 1013.

The first driving unit 1030 may include a first ring gear 1030_1*a*, a second ring gear 1030_1*b*, a first motor 1030_2, a first connecting shaft 1030_3, and a first wire 1030_4. Additionally, a first ring gear body 1030_5*a* connected to the first ring gear 1030_1*a* and a second ring gear body 1030_5*b* connected to the second ring gear 1030_1*b* may be included.

The first ring gear 1030_1*a* is provided in a circular band shape having a predetermined thickness, and may have a shape in which irregularities are regularly arranged on an outer circumferential surface. The first motor 1030_2 may be connected to a side surface of the first ring gear 1030_1*a*. Accordingly, the first ring gear 1030_1*a* may rotate in the clockwise direction or in the counterclockwise direction, according to the operating direction of the first motor 1030_2. The irregularities formed on the outer circumferential surface of the first ring gear 1030_1*a* may be coupled (or fastened) to the at least one guide rail 1140*c* formed on the back surface of the display support member 1140 as described above. Accordingly, when the first motor 1030_2 is operated and the first ring gear 1030_1*a* rotates in the counterclockwise direction, the first ring gear 1030_1*a* may rotate in the first direction.

In the first motor 1030_2, one side of the central shaft may be coupled with one side surface of the first ring gear 1030_1*a*. The first motor 1030_2 may operate by receiving electrical power from a battery (not illustrated) connected to the printed circuit board 1011 via the first wire 1030_4. In this case, the first motor 1030_2 may rotate in the clockwise direction or in the counterclockwise direction according to the operation of the processor 1012. The other side of the central shaft of the first motor 1030_2 may be connected to the first connecting shaft 1030_3.

The first connecting shaft 1030_3 may be connected to the other side of the central shaft of the first motor 1030_2 and one side surface of the second ring gear 1030_1*b*. The first connecting shaft 1030_3 may serve to transmit, to the second ring gear 1030_1*b*, the force generated while the first motor 1030_2 rotates.

One side of the first wire 1030_4 may be connected to the first motor 1030_2 via the first connecting shaft 1030_3. The other side of the first wire 1030_4 may be connected to one side of the printed circuit board 1011. The first wire 1030_4 may transmit, to the first motor 1030_2, electric power from the battery of the electronic device 1000. Further, the first wire 1030_4 may transmit, to the first motor 1030_2, a control signal of the processor 1012 mounted on the printed circuit board 1011. The first wire 1030_4 may be provided in various forms, such as a cable or an FPCB.

The second ring gear 1030_1*b* may be disposed at a position symmetrical to the first ring gear 1030_1*a* based on a point where the first wire 1030_4 and the first connecting shaft 1030_3 are connected. The second ring gear 1030_1*b* may be provided in substantially the same shape as or similar shape to the first ring gear 1030_1*a*. For example, the second ring gear 1030_1*b* may be provided in a disc-belt shape having a predetermined width, and irregularities may be regularly formed on the outer circumferential surface. The irregularity pattern of the second ring gear 1030_1*b* may be coupled (or fastened) to the at least one guide rail 1140*c* formed on the back surface of the display support member 1140. The second ring gear 1030_1*b* may receive, via the first connecting shaft 1030_3, power according to the operation of the first motor 1030_2, and may rotate in the same direction as the first ring gear 1030_1*a*.

The second driving unit 1055 may be driven in conjunction with the first driving unit 1030. The second driving unit 1055 may include a first gear part 1055_1*a*, a second gear part 1055_1*b*, a second motor 1055_2, a second connecting shaft 1055_3, and a second wire 1055_4.

The outer surface of the first gear part 1055_1*a* may be formed in a gear pattern. The second motor 1055_2 may be disposed inside the first gear part 1055_1*a*. The second motor 1055_2 is connected inside the first gear part 1055_1*a*, and may be disposed to rotate in a specific direction according to the operation of the second motor 1055_2. In this regard, the second motor 1055_2 includes a central shaft, and the central shaft of the second motor 1055_2 may be fastened to or coupled with an inner end of the first gear part 1055_1*a*.

The second motor 1055_2 may be disposed inside the first gear part 1055_1*a*, and the central shaft of the second motor 1055_2 may be coupled (or fastened) to the first gear part 1055_1*a*. The other side of the second motor 1055_2 may be connected to the second connecting shaft 1055_3. The second motor 1055_2 may operate depending on electric power transmitted via the second wire 1055_4, and may transmit power generated according to the operation to the first gear part 1055_1*a*.

The second connecting shaft 1055_3 may have one end connected to the central shaft of the second motor 1055_2, and the other end connected to one end of the second gear part 1055_1*b*. In addition, the second wire 1055_4 may be disposed in at least either inside or outside the second connecting shaft 1055_3.

The second wire 1055_4 has one end connected to the second motor 1055_2 via the second connecting shaft 1055_3, and the other end connected to the printed circuit board 1011. The second wire 1055_4 may transmit, to the second motor 1055_2, electric power from the battery of the electronic device 1000, and may transmit, to the second motor 1055_2, a control signal of the processor 1012, which is similar to the first wire 1030_4.

On the other hand, in the above description, an example in which the first motor 1030_2 is disposed on the inner side of the first ring gear 1030_1*a*, and the second motor 1055_2 is disposed inside the first gear part 1055_1*a* has been described; however, the disclosure is not limited thereto. For example, the first motor 1030_2 may be disposed outside the first ring gear 1030_1*a* and may be disposed in a structure in which a rotating force is transmitted to the first ring gear 1030_1*a*. Similarly to the first motor 1030_2, the second motor 1055_2 may also be disposed outside the first gear part 1055_1a, and may be disposed in a structure in which the force generated by the operation is transmitted to the first gear part 1055_1a.

The printed circuit board 1011 may be disposed between the first driving unit 1030 and the second driving unit 1055. According to an embodiment of the disclosure, the printed circuit board 1011 may be connected to the first wire 1030_4 for supplying electric power and control signals to the first driving unit 1030. In addition, the printed circuit board 1011 may be connected to the second wire 1055_4 for supplying electric power and control signals to the second driving unit 1055. According to various embodiments of the disclosure, the printed circuit board 1011 may be at least partially disposed in the sliding structure 1150 described above, and may move in the first direction or in the second direction opposite to the first direction with the movement of the sliding structure 1150. The processor 1012 and the memory 1013 may be mounted on the printed circuit board 1011.

The processor 1012 may be mounted on the printed circuit board 1011, generate a control signal according to a user input, and transmit the generated signal to the first motor 1030_2 and the second motor 1055_2. For example, the processor 1012 may generate control signals for controlling the rotation speed and direction of the first motor 1030_2, and the rotation speed and direction of the second motor 1055_2, and transmit the generated control signals to the first motor 1030_2 and the second motor 1055_2 via the first wire 1030_4 and the second wire 1055_4, respectively. According to various embodiments of the disclosure, the processor 1012 may generate control signals for controlling the first motor 1030_2 and the second motor 1055_2 to rotate in the same direction to transmit the control signals to the first motor 1030_2 and the second motor 1055_2, respectively. Alternatively, the processor 1012 may generate a control signal for making the rotation direction of one of the first motor 1030_2 or the second motor 1055_2 different, and supply the generated control signal to the first motor 1030_2 and the second motor 1055_2.

The memory 1013 may store various setting values related to driving the electronic device 1000. For example, the memory 1013 may store setting values for controlling the first motor 1030_2 and the second motor 1055_2 when the electronic device 1000 switches between the state 1001 and the state 1003. Alternatively, the memory 1013 may store event values set to perform expansion or reduction of the second display region 1160b (e.g., automatic expansion when a camera function is executed, automatic reduction when a call function is executed, selection expansion or reduction when an internet search function is executed, and so on).

Figure 12:
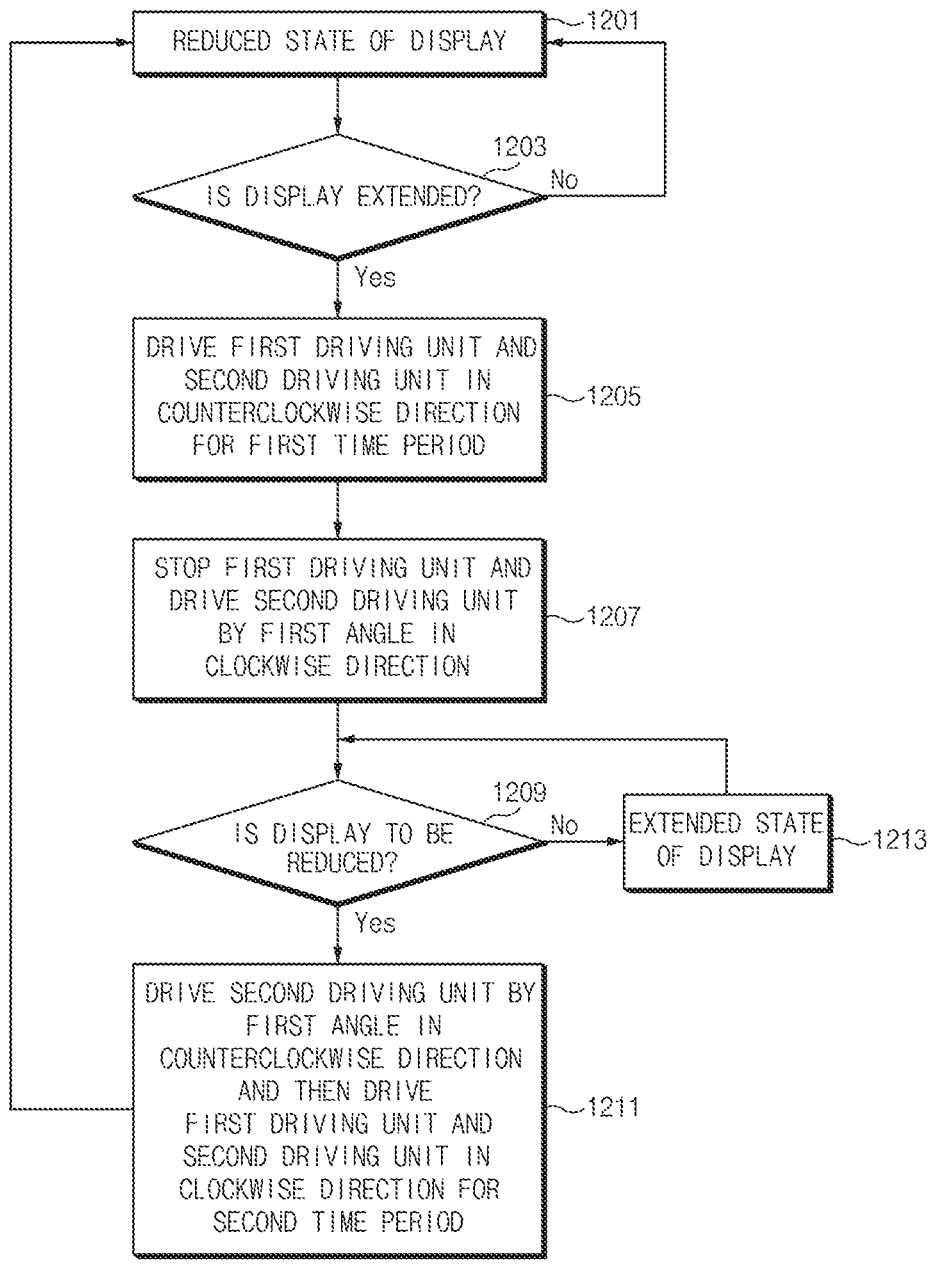
FIG. 12 is a flowchart illustrating a method of operating an electronic device according to an embodiment of the disclosure.

FIG. 12 is a flowchart illustrating a method of operating an electronic device according to an embodiment of the disclosure.

Referring to FIG. 12, regarding the method of operating the electronic device 1000 according to an embodiment of the disclosure, the processor 1012 of the electronic device 1000 may maintain a reduced state of the display 1160 in operation 1201. In the reduced state of the display 1160, the processor 1012 may adjust the rotation directions of the first motor 1030_2 and the second motor 1055_2 such that the second display region 1160b moves to the inner side of the second cover 1082. For example, the processor 1012 may control the first motor 1030_2 and the second motor 1055_2 such that they rotate in the clockwise direction. In this operation, the processor 1012 may determine the number of rotations of the first motor 1030_2 and the second motor 1055_2. For example, the processor 1012 may determine, according to the user setting, the first number of rotations used to perform control such that the whole second display region 1160b is displayed on the inner side of the second cover 1082, or the numbers of rotations of at least one of the first motor 1030_2 and the second motor 1055_2 used such that a portion of the second display region 1160b is disposed to be directed in the same direction as the first display region 1160a and only a portion is disposed on the inner side of the second cover 1082.

According to various embodiments of the disclosure, the processor 1012 may adjust the numbers of rotations of the first motor 1030_2 and the second motor 1055_2 corresponding to receiving the user input. In this regard, the display 1160 may output a screen interface related to size adjustment of the second display region 1160b. The processor 1012 may determine the size adjustment of the second display region 1160b corresponding to the touch input of the user, and may determine the numbers of rotations of the motors corresponding to the size adjustment. The processor 1012 may fix the first motor 1030_2 and the second motor 1055_2 after the size adjustment of the second display region 1160b is determined. Alternatively, the processor 1012 may perform control such that the first motor 1030_2 is fixed and the second motor 1055_2 further rotates by a predetermined angle in a direction opposite to the reduction direction of the second display region 1160b. For example, the processor 1012 may perform control such that the first motor 1030_2 and the second motor 1055_2 rotates by the same number of rotations, and then the second motor 1055_2 further rotates by a predetermined angle in the clockwise direction. By increasing the tension of the second display region 1160b placed between the first driving unit 1030 and the second driving unit 1055 through this, the processor 1012 may perform control such that the second display region 1160b maintain the flat state without lifting. According to various embodiments of the disclosure, the electronic device 1000 may further include a stopper for fixing the second driving unit 1055 after the second driving unit 1055 is driven by the additional angle in the clockwise direction. The stopper may serve to temporarily fix the second driving unit 1055 after the second driving unit 1055 is further rotated by the additional angle. If the electronic device 1000 is extended, the stopper may be disposed to temporarily release the fixing of the second driving unit 1055.

In operation 1203, the processor 1012 may identify whether or not an input signal for extending the display 1160 is generated. If there is no reception of the input signal for extending the display 1160, the processor 1012 may perform control to maintain the state 1201. If the input signal (e.g., a user input) requesting extension of the display 1160 is generated, the processor 1012 may control the first driving unit 1030 and the second driving unit 1055 to be driven in the counterclockwise direction for a first time period in operation 1205. Alternatively, the processor 1012 may control the numbers of rotations of the first motor 1030_2 of the first driving unit 1030 and the second motor 1055_2 of the second driving unit 1055 such that they are rotated by a specified number of rotations. While the first driving unit 1030 and the second driving unit 1055 operate for the first time period (or by a first number of rotations), the first driving unit 1030 moves in the first direction, and the second driving unit 1055 also moves in the first direction as in the first driving unit 1030, rotating the panel support 1170, which, in turn, the second display region 1160b positioned on the panel support 1170 may be repositioned to be directed in the same direction as that of the first display region 1160a.

In operation 1207, the processor 1012 may stop the first driving unit 1030 and drive the second driving unit 1055 by a first angle in a clockwise direction. The first angle may vary depending on the tension of the second display region 1160b. As described above, the processor 1012 may increase the overall tension of the display 1160 by driving the second driving unit 1055 by the first angle in the clockwise direction, which makes it possible to provide support for maintaining a more flat state.

In operation 1209, the processor 1012 may identify whether or not a signal requesting that the display 1160 is to be reduced occurs. For example, the processor 1012 may identify whether or not a user input or a specified application execution event occurs that requests that the display 1160 is to be reduced. If there is no event requesting that the display is to be reduced, the processor 1012 may perform control to maintain the extended state of the display 1160 in operation 1213.

If the event requesting that the display 1160 is to be reduced (e.g., the user input or the specific function execution event) occurs, in operation 1211, the processor 1012 may drive the second driving unit 1055 by the first angle in the counterclockwise direction, and drive the first driving unit 1030 and the second driving unit 1055 for a second time (or by a second number of rotations) in the clockwise direction, thereby changing the display 1160 into the reduced state. Here, the second time (or the second number of rotations) may include, for example, a time period substantially the same as the first time period (or the first number of rotations) described above.

As described above, the control method of the electronic device 1000 according to an embodiment may process the movement of the second display region 1160b and the second cover 1082 covering it more smoothly by generating and operating power required to expand or reduce the second display region 1160b using the first driving unit 1030 and the second driving unit 1055. In addition, the electronic device 1000 increases the tension of the display 1160 by fixing the first driving unit 1030 and further rotating the second driving unit 1055 (or the second motor 1055_2) by a specified angle in a clockwise direction in the process of extending or reducing the display 1160, which makes it possible to control the display 1160 to maintain a more flat state.

As described above, an electronic device according to various embodiments may include a first cover, a second cover coupled (or fastened) to the first cover to slide, a display in which a size of an exposed region is changed corresponding to the sliding of the second cover, a display support member supporting a first region of the display, a sliding structure at least partially disposed under the display support member, a first driving unit at least partially coupled (or fastened) to a guide rail formed on the bottom of the display support member and moving the sliding structure in a first direction or a second direction opposite to the first direction, a panel support including a plurality of protrusions disposed on a back surface of a second region of the display based on a front surface of the display on which a screen is displayed, a second driving unit contacting at least a portion of the panel support and performing a rotation required for winding of the panel support, and at least one processor configured to control operations of the first driving unit and the second driving unit.

According to various embodiments of the disclosure, the processor may control the first driving unit and the second driving unit to operate in a counterclockwise direction for a same time or by a same number of rotations when an event requesting extension of the display occurs.

According to various embodiments of the disclosure, the processor may be configured to control the first driving unit to be fixed and the second driving unit to further rotate by the first angle in a clockwise direction, after completing the extension of the display.

According to various embodiments of the disclosure, the processor may control the first driving unit and the second driving unit to operate in a clockwise direction for a same time or by a same number of rotations when an event requesting reduction of the display occurs.

According to various embodiments of the disclosure, the processor may be configured to control extension or reduction of the display according to a user input or a request to execute a specified application.

As described above, an electronic device according to a first embodiment may include a first cover means (e.g., a cover means, a cover assembly, a cover member, or a cover structure), a second cover means (e.g., a cover means, a cover assembly, a cover structure, or a cover member) coupled (or fastened) to the first cover means to slide, a display element (e.g., a display element, a display means, or a display assembly) in which a size of an exposed region is changed corresponding to the sliding of the second cover means, a panel support means (e.g., a panel support means, a panel support assembly, a panel support structure, a panel support frame, or a panel support bracket) disposed on one side of a back surface of the display element based on a front surface of the display element on which a screen is displayed, and a rotation shaft means (e.g., a rotation shaft means or an assembly structure) contacting at least a portion of the panel support means and rotating corresponding to the sliding of the second cover means, at least a portion of the panel support means may include a plurality of protrusion means (e.g., a means, an assembly, or a structure), and an attractive force may be formed between at least a portion of the rotation shaft means and at least some of the plurality of protrusion means.

According to a second embodiment of the disclosure, further in the first embodiment of the disclosure, in a state in which a portion of the display element is bent around the rotation shaft means, the attractive force may be formed between the portion of the rotation shaft means and protrusion means contacting the rotation shaft means among the plurality of protrusion means disposed on the panel support means.

According to a third embodiment of the disclosure, in the first embodiment or the second embodiment of the disclosure, in a state in which the second cover means has slid such that a size of the display element is expanded, the attractive force may be formed between the portion of the rotation shaft means and at least some of the protrusions contacting the rotation shaft means.

According to a fourth embodiment of the disclosure, in any one of the first embodiment to the third embodiment of the disclosure, at least some of the plurality of protrusions means may be formed of at least one of a magnetic material or a ferromagnetic material that reacts to magnetic force, or a permanent magnet.

According to a fifth embodiment of the disclosure, in any one of the first embodiment to the fourth embodiment of the disclosure, the portion of the rotation shaft means may be formed of at least one of a material that reacts to magnetic force or a permanent magnet.

According to a sixth embodiment of the disclosure, in any one of the first embodiment to the fifth embodiment of the disclosure, the display element may include a first display region having a fixed disposition form, and a second display region in which an exposed region is changed with the movement of the panel support means.

According to a seventh embodiment of the disclosure, in the sixth embodiment of the disclosure, the rotation shaft means may operate as an electromagnet depending on electric power supplied based on a coil disposed on an inner side, operate as an electromagnet when the second display region is expanded to a maximum, or operate as an electromagnetic when the second display region is formed to a minimum.

According to an eighth embodiment of the disclosure, in any one of the first embodiment to the seventh embodiment of the disclosure, the panel support means may include a gear pattern in which the protrusion means and troughs are repeated, and first protrusion means protruding in a direction parallel with the display element on at least one side of the protrusion means.

According to a ninth embodiment of the disclosure, in any one of the first embodiment to the eighth embodiment of the disclosure, the rotation shaft means may include at least one of second protrusion means including a gear corresponding to the gear pattern of the panel support means and being temporarily coupled with the first protrusion means when contacting one side of the panel support means, and hook groove means being temporarily coupled with the first protrusion means when contacting the one side of the panel support means.

According to a tenth embodiment of the disclosure, in any one of the first embodiment to the ninth embodiment of the disclosure, the electronic device may further include a protective member disposed between at least one of the first cover means and the second cover means and the panel support means to protect a portion of the display panel element.

According to an eleventh embodiment of the disclosure, in any one of the first embodiment to the tenth embodiment of the disclosure, the electronic device may further include an elastic member having one end fixed to one side inside and the other end connected to an end of the panel support means.

According to a twelfth embodiment of the disclosure, in any one of the first embodiment to the eleventh embodiment of the disclosure, the panel support means may include a substrate means of a predetermined thickness disposed on the back surface of the display element, and gear peaks repeatedly protruding by a predetermined height on the substrate means.

According to a thirteenth embodiment of the disclosure, in any one of the first embodiment to the twelfth embodiment of the disclosure, at least a portion of the panel support means may be formed of an elastic material.

According to a fourteenth embodiment of the disclosure, in any one of the first embodiment to thirteenth embodiment of the disclosure, the electronic device may further include a magnetic force-related member disposed at a position adjacent to the inner surface of the panel support means.

According to a fifteenth embodiment of the disclosure, in any one of the first embodiment to the fourteenth embodiment of the disclosure, the magnetic force related-member may be disposed between at least a portion of the first display region exposed outside in a state in which the display element is wound and at least a portion of the second display region disposed inside the electronic device.

An electronic device, according to a sixteenth embodiment of the disclosure, may include a first cover means, a second cover means coupled (or fastened) to the first cover means to slide, a display element in which a size of an exposed region is changed corresponding to the sliding of the second cover means, a display support member (or means) supporting a first region of the display element, a sliding structure at least partially disposed under the display support member, a first driving member (or means) at least partially coupled (or fastened) to a guide rail formed on the bottom of the display support member and moving the sliding structure in a first direction or a second direction opposite to the first direction, a panel support means including a plurality of protrusion means disposed on a back surface of a second region of the display element based on a front surface of the display element on which a screen is displayed, a second driving means (or member) unit contacting at least a portion of the panel support means and performing a rotation required for winding of the panel support means, and a processor (or processing means) controlling operations of the first driving means and the second driving means.

According to a seventeenth embodiment of the disclosure, in the sixteenth embodiment of the disclosure, the processor may control the first driving means and the second driving means to operate in a counterclockwise direction for a same time or by a same number of rotations when an event requesting extension of the display element occurs.

According to an eighteenth embodiment of the disclosure, in the sixteenth embodiment or the seventeenth embodiment of the disclosure, the processor may control the first driving means to be fixed and the second driving means to further rotate by a first angle in a clockwise direction, after completing the extension of the display element.

According to a nineteenth embodiment of the disclosure, in any one of the sixteenth embodiment to the eighteenth embodiment of the disclosure, the processor may control the first driving means and the second driving means to operate in a clockwise direction for the same time or by the same number of rotations when an event requesting reduction of the display element occurs.

According to a twentieth embodiment of the disclosure, in any one of the sixteenth embodiment to the nineteenth embodiment of the disclosure, the processor may be configured to control extension or reduction of the display element according to a user input or a request to execute a specified application.

Each component (e.g., module or program) according to various embodiments may be made up of a singular or a plurality of entities, and some of the aforementioned sub-components may be omitted, or other sub-components may be further included in various embodiments of the disclosure. Alternatively or additionally, some components (e.g., modules or programs) may be integrated into one entity, performing the same or similar functions performed by respective corresponding components before integration. According to various embodiments of the disclosure,

The invention claimed is:
1. An electronic device for supporting sliding, the electronic device comprising:
 a first cover;
 a second cover coupled to the first cover to slide;
 a display in which a size of an exposed region is changed corresponding to the sliding of the second cover;
 a panel support disposed on one side of a back surface of the display with respect to a front surface of the display on which a screen is displayed; and a rotation shaft contacting at least a portion of the panel support and rotating corresponding to the sliding of the second cover, wherein the portion of the panel support comprises a plurality of protrusions, wherein an attractive force is formed between the portion of the rotation shaft and at least some of the plurality of protrusions, wherein the rotation shaft comprises hook grooves temporarily coupled with the plurality of protrusions when contacting one side of the panel support, and wherein the plurality of protrusions include a hook portion protruding in a direction opposite to a protruding direction of the hook grooves formed on the rotation shaft.

2. The electronic device of claim 1, wherein in a state in which a portion of the display is bent around the rotation shaft, the attractive force is formed between the portion of the rotation shaft and protrusions contacting the rotation shaft among the plurality of protrusions disposed on the panel support.

3. The electronic device of claim 2, wherein in a state in which the second cover has slid such that a size of the display is expanded, the attractive force is formed between the portion of the rotation shaft and the at least some of the protrusions contacting the rotation shaft.

4. The electronic device of claim 3, wherein the at least some of the plurality of protrusions is formed of a magnetic material or a ferromagnetic material that reacts to magnetic force, or a permanent magnet.

5. The electronic device of claim 4, wherein the portion of the rotation shaft comprises a material that reacts to magnetic force or a permanent magnet.

6. The electronic device of claim 5, wherein the display comprises:
a first display region having a fixed disposition form; and
a second display region in which an exposed region is changed with a movement of the panel support.

7. The electronic device of claim 6, wherein the rotation shaft operates as:
an electromagnet depending on electric power supplied based on a coil disposed on an inner side,
an electromagnet when the second display region is expanded to a maximum, or
an electromagnetic when the second display region is formed to a minimum.

8. The electronic device of claim 7, wherein the panel support comprises:
a gear pattern in which the protrusions and troughs are repeated; and
first protrusions protruding in a direction parallel with the display on at least one side of the at least some of the plurality of protrusions.

9. The electronic device of claim 8, further comprising a protective member disposed between at least one of the first cover or the second cover and the panel support to protect a portion of the display.

10. The electronic device of claim 9, further comprising an elastic member having one end fixed to one side inside the electronic device and another end connected to an end of the panel support.

11. The electronic device of claim 10, wherein the panel support comprises:
a substrate portion of a predetermined thickness disposed on the back surface of the display; and
gear peaks repeatedly protruding by a predetermined height on the substrate portion.

12. The electronic device of claim 11, wherein the portion of the panel support is formed of an elastic material.

13. The electronic device of claim 12, further comprising a magnetic force-related member disposed at a position adjacent to an inner surface of the panel support.

14. The electronic device of claim 13, wherein the magnetic force-related member is disposed between the portion of the first display region exposed outside in a state in which the display is wound and the portion of the second display region disposed inside the electronic device.

15. An electronic device for supporting sliding, the electronic device comprising:
a first cover;
a second cover coupled to the first cover to slide;
a display in which a size of an exposed region is changed corresponding to the sliding of the second cover;
a display support member supporting a first region of the display;
a sliding structure at least partially disposed under the display support member;
a first driving unit at least partially coupled to a guide rail formed on a bottom of the display support member and moving the sliding structure in a first direction or a second direction opposite to the first direction;
a panel support including a plurality of protrusions disposed on a back surface of a second region of the display with respect to a front surface of the display on which a screen is displayed;
a second driving unit contacting at least a portion of the panel support and performing a rotation required for winding of the panel support; and
at least one processor configured to control operations of the first driving unit and the second driving unit,
wherein the second driving unit including hook grooves temporarily coupled with the plurality of protrusions when contacting one side of the panel support, and
wherein the plurality of protrusions include a hook portion protruding in a direction opposite to a protruding direction of the hook grooves formed on the second driving unit.

16. The electronic device of claim 15, wherein the at least one processor is further configured to control the first driving unit and the second driving unit to operate in a counterclockwise direction for a same time period or by a same number of rotations when an event requesting extension of the display occurs.

17. The electronic device of claim 15, wherein the at least one processor is further configured to, after completing an extension of the display, control the first driving unit to be fixed and the second driving unit to further rotate by a first angle in a clockwise direction.

18. The electronic device of claim 15, wherein the at least one processor is further configured to control the first driving unit and the second driving unit to operate in a clockwise direction for a same time period or by a same number of rotations when an event requesting reduction of the display occurs.

19. The electronic device of claim 15, wherein the at least one processor is further configured to control an extension or a reduction of the display according to a user input or a request to execute a specified application.

20. The electronic device of claim 16, further comprising:
a rotation shaft contacting the portion of the panel support and rotating corresponding to the sliding of the second cover.

21. The electronic device of claim 20, wherein in a state in which a portion of the display is bent around the rotation shaft, an attractive force is formed between the portion of the rotation shaft and protrusions contacting the rotation shaft among the plurality of protrusions.

22. The electronic device of claim 21, wherein in a state in which the second cover has slid such that a size of the display is expanded, the attractive force is formed between the portion of the rotation shaft and the at least some of the protrusions contacting the rotation shaft.

23. The electronic device of claim 20, wherein the at least some of the plurality of protrusions is formed of a magnetic material or a ferromagnetic material that reacts to magnetic force, or a permanent magnet.

\* \* \* \* \*